United States Patent
Ogino

(10) Patent No.: US 6,603,311 B2
(45) Date of Patent: Aug. 5, 2003

(54) METHOD AND APPARATUS FOR MAGNETIC RESONANCE SIGNAL ACQUISITION AND MAGNETIC RESONANCE IMAGING APPARATUS

(75) Inventor: Tetsuo Ogino, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 106 days.

(21) Appl. No.: 09/950,302

(22) Filed: Sep. 11, 2001

(65) Prior Publication Data

US 2002/0097048 A1 Jul. 25, 2002

(30) Foreign Application Priority Data

Nov. 21, 2000 (JP) .......................... 2000-354100

(51) Int. Cl.$^7$ ................................. G01V 3/00
(52) U.S. Cl. ................. 324/309; 324/307; 324/306
(58) Field of Search ................. 324/309, 307, 324/306, 303, 311

(56) References Cited

U.S. PATENT DOCUMENTS

| 5,064,638 A | * 11/1991 | Moore et al. .................. 424/9 |
| 5,221,898 A | * 6/1993 | Takiguchi et al. .......... 324/306 |
| 5,278,501 A | * 1/1994 | Guilfoil et al. ............. 324/303 |
| 5,929,637 A | * 7/1999 | Taguchi et al. ............. 324/306 |
| 6,144,202 A | * 11/2000 | Kanazawa et al. .......... 324/309 |

* cited by examiner

Primary Examiner—Edward Lefkowitz
Assistant Examiner—Brij B. Shrivastav
(74) Attorney, Agent, or Firm—Moonray Kojima

(57) ABSTRACT

For the purpose of acquiring the magnetic resonance signal having a small Maxwell term, a flow encode gradient Gr having the first half and the second half in which the gradient of the respective halves is reversed and having an equal absolute value of the gradient is applied in the readout gradient direction in a time period coincident with the time period when the spin is rephased by means of the slice gradient, and a flow encode gradient having the first half and the second half in which the gradient of the respective halves is reversed and having an equal absolute value of the gradient is applied in the slice gradient direction in a time period coincident with the time period when the spin is dephased by means of the readout gradient.

21 Claims, 22 Drawing Sheets

FIG. 7

|        | Gr direction | Gp direction | Gs direction |
|--------|:------------:|:------------:|:------------:|
| FIG. 3 | +            | +            | +            |
| FIG. 4 | -            | +            | +            |
| FIG. 5 | +            | -            | +            |
| FIG. 6 | +            | +            | -            |

METHOD AND APPARATUS FOR MAGNETIC RESONANCE SIGNAL ACQUISITION AND MAGNETIC RESONANCE IMAGING APPARATUS

BACKGROUND OF THE INVENTION

This invention relates to a method and apparatus for magnetic resonance signal acquisition and a magnetic resonance imaging apparatus, and more particularly relates to a method and apparatus for magnetic resonance signal acquisition for magnetic resonance imaging based on a phase contrast method and a magnetic resonance imaging apparatus for magnetic resonance imaging based on the phase contrast method.

A magnetic resonance imaging (MRI) apparatus generates a magnetic resonance signal by applying a gradient magnetic field and a high frequency magnetic field wherein in the magnetic resonance imaging apparatus an imaging target has been placed in the internal space of a magnet system, namely the space where a static magnetic field is formed, and forms (restructures) a tomographic image based on the received signal.

The phase contract method has been known as one of the method for imaging the flow of blood or the like in an organism. In this method, the gradient magnetic field that does not change the phase of the spin the position of which is not changed during imaging, and the gradient magnetic field that changes the phase of only the spin the position of which is changed during imaging is used. Such a gradient magnetic field is called flow encode gradient magnetic field.

The flow encode gradient magnetic field is the method in which two magnetic fields having inverse gradients are applied for an equal time successively. By applying such a gradient magnetic field, the phase of the spin of no positional change changes in one direction in the first half time of the gradient magnetic field application period and changes in the inverse direction in the second half time by the same magnitude. The phase of the spin of no positional change does not change after all. On the other hand, the phase of the spin of positional change along the gradient of the magnetic field changes in one direction in the first half time of the gradient magnetic field application period but changes in the second half time by the different magnitude because the intensity of the magnetic field is different between first half and second half due to the positional change. The phase of the spin of positional change does not return to the original phase and causes the change from the original phase.

In the case that the flow contrast method is applied, two gradient magnetic fields that allow the spin of positional change to cause inverse phase changes at different timings are used as a pair of flow encode gradient magnetic field. The difference between the magnetic resonance signal obtained under the one flow encode gradient magnetic field and the magnetic resonance signal obtained under the other flow encode gradient magnetic field is calculated in order to offset the magnetic resonance signal is the spin of no positional change, and only the magnetic resonance signal of the moving spin remains there. By restructuring of an image based on the abovementioned magnetic resonance signal, an image of the moving spin, namely for example an image of a blood flow image, can be obtained.

However to say strictly, the phase of the no positional spin causes the change due to Maxwell term arising from the flow encode gradient magnetic filed. Because the phase change due to the one flow encode gradient magnetic field of the pair is generally different from the phase change due to the other flow encode gradient magnetic field of the pair, and the phase change signal of the spin of no positional change remains residual in the difference of the magnetic resonance signal. Therefore, the flow image includes an image of a static portion as a residual image. The lower static magnetic field gives the larger Maxwell term, and the residual image is more remarkable on the flow imaging in the lower magnetic field application.

SUMMARY OF THE INVENTION

Therefore, it is the object of the present invention to realize a method and an apparatus for magnetic resonance signal acquisition for acquiring a magnetic resonance signal having a small Maxwell term, and to realize a magnetic resonance imaging apparatus having the abovementioned magnetic resonance signal acquisition apparatus.

(1) An aspect of the invention to be applied to solve the abovementioned problem involves a magnetic resonance signal acquisition method for acquiring a magnetic resonance signal from a target by means of a phase contrast method by use of a static magnetic field, a high frequency magnetic field, a slice gradient magnetic field, a phase encode gradient magnetic field, a readout gradient magnetic field, and a flow encode gradient magnetic field characterized in that a flow encode gradient magnetic field having the first half and the second half in which the gradient of the respective halves is reversed and having an equal absolute value of the gradient is applied in the direction of the readout gradient magnetic field in a time period coincident with the time period when the spin of the target is rephased by means of the slice gradient magnetic field.

In the invention of this aspect, the flow encode gradient magnetic field is converted to a gradient magnetic field having the first half and the second half that have the gradient direction opposite to each other and that have the same absolute gradient value, and the spin is applied to the readout gradient magnetic field direction in a time period coincident with the rephase time period by means of the slice gradient magnetic field, and as the result the Maxwell term can be reduced to 0.

(2) An another aspect of the invention to be applied to solve the abovementioned problem involves a magnetic resonance signal acquisition method for acquiring a magnetic resonance signal from a target by means of a phase contrast method by use of a static magnetic field, a high frequency magnetic field, a slice gradient magnetic field, a phase encode gradient magnetic field, a readout gradient magnetic field, and a flow encode gradient magnetic field characterized in that a flow encode gradient magnetic field having the first half and the second half in which the gradient of the respective halves is reversed and having an equal absolute value of the gradient is applied in the direction of the slice gradient magnetic field in a time period coincident with the time period when the spin of the target is dephased by means of the readout gradient magnetic field.

In the invention of this aspect, the flow encode gradient magnetic field is converted to a gradient magnetic field having the first half and the second half that have the gradient direction opposite to each other and that have the same absolute gradient value, and the spin is applied to the slice gradient magnetic field direction in a time period coincident with the dephase time period by means of the readout gradient magnetic field, and as the result the Maxwell term can be reduced to 0.

(3) An another aspect of the invention to be applied to solve the abovementioned problem involves a magnetic resonance signal acquisition method for acquiring a magnetic resonance signal from a target by means of a phase contrast method by use of a static magnetic field, a high frequency magnetic field, a slice gradient magnetic field, a phase encode gradient magnetic field, a readout gradient magnetic field, and a flow encode gradient magnetic field characterized in that a flow encode gradient magnetic field having the first half and the second half in which the gradient of the respective halves is reversed and having an equal absolute value of the gradient is applied in the direction of the readout gradient magnetic field in a time period coincident with the time period when the spin of the target is rephased by means of the slice gradient magnetic field, and a flow encode gradient magnetic field having the first half and the second half in which the gradient of the respective halves is reversed and having an equal absolute value of the gradient is applied in the direction of the slice gradient magnetic field in a time period coincident with the time period when the spin of the target is dephased by means of the readout gradient magnetic field.

In the invention of this aspect, the flow encode gradient magnetic field is converted to a gradient magnetic field having the first half and the second half that have the gradient direction opposite to each other and that have the same absolute gradient value, and the spin is applied to the readout gradient magnetic field direction in a time period coincident with the rephase time period by means of the slice gradient magnetic field, and the flow encode gradient magnetic field is converted to a gradient magnetic field having the first half and the second half that nave the gradient direction opposite to each other and that have the same absolute gradient value, and the spin is applied to the slice gradient magnetic field direction in a time period coincident with the dephase time period by means of the readout gradient magnetic field, and as the result the Maxwell term can be reduced to 0.

(4) An another aspect of the invention to be applied to solve the abovementioned problem involves a magnetic resonance signal acquisition method described in any one of (1) to (3) characterized in that the first half of a flow encode gradient magnetic field having the first half and the second half in which the gradient of the respective halves is reversed and having an equal absolute value of the gradient is applied in the direction of the phase encode gradient magnetic field in the time period coincident with the time period when the spin of the target is rephased by means of the slice gradient magnetic field, and the second half of a flow encode gradient magnetic field having the first half and the second half in which the gradient of the respective halves is reversed and having an equal absolute value of the gradient is applied in the direction of the phase encode gradient magnetic field in the time period coincident with the time period when the spin of the target is dephased by means of the readout gradient magnetic field.

In the invention of this aspect, in addition to the abovementioned (1) to (3), the first half of the flow encode gradient magnetic field having the first half and the second half in which the gradient of the respective halves is reversed and having an equal absolute value of the gradient is applied in the direction of the phase encode gradient magnetic field in the time period coincident with the time period when the spin is rephased by means of the slice gradient magnetic field, and the second half of a flow encode gradient magnetic field having the first half and the second half in which the gradient of the respective halves is reversed and having an equal absolute value of the gradient is applied in the direction of the phase encode gradient magnetic field in the time period coincident with the time period when the spin of the target is dephased by means of the readout gradient magnetic field, as the result the Maxwell term is reduced to a small value.

(5) An another aspect of the invention to be applied to solve the abovementioned problem involves a magnetic resonance signal acquisition apparatus for acquiring a magnetic resonance signal of a target by means of phase contrast method by use of a static magnetic field, a high frequency magnetic field, a slice gradient magnetic field, a phase encode gradient magnetic field, a readout gradient magnetic field, and a flow encode gradient magnetic field characterized by comprising a gradient magnetic field application means in which a flow encode gradient magnetic field having the first half and the second half in which the gradient of the respective halves is reversed and having an equal absolute value of the gradient is applied in the direction of the readout gradient magnetic field in a time period coincident with the time period when the spin of the target is rephased by means of the slice gradient magnetic field.

In the invention of this aspect, the flow encode gradient magnetic field is converted to a gradient magnetic field having the first half and the second half that have the gradient direction opposite to each other and that have the same absolute gradient value, and the spin is applied to the readout gradient magnetic field direction in a time period coincident with the rephase time period by means of the slice gradient magnetic field, and as the result the Maxwell term can be reduced to 0.

(6) An another aspect of the invention to be applied to solve the abovementioned problem involves a magnetic resonance signal acquisition apparatus for acquiring a magnetic resonance signal from a target by means of a phase contrast method by use of a static magnetic field, a high frequency magnetic field, a slice gradient magnetic field, a phase encode gradient magnetic field, a readout gradient magnetic field, and a flow encode gradient magnetic field characterized by comprising a gradient magnetic field application means in which a flow encode gradient magnetic field having the first half and the second half in which the gradient of the respective halves is reversed and having an equal absolute value of the gradient is applied in the direction of the slice gradient magnetic field in a time period coincident with the time period when the spin of the target is dephased by means of the readout gradient magnetic field.

In the invention of this aspect, the flow encode gradient magnetic field is converted to a gradient magnetic field having the first half and the second half that have the gradient direction opposite to each other and that have the same absolute gradient value, and the spin is applied to the slice gradient magnetic field direction in a time period coincident with the dephase time period by means of the readout gradient magnetic field, and as the result the Maxwell term can be reduced to 0.

(7) An another aspect of the invention to be applied to solve the abovementioned problem involves a magnetic resonance signal acquisition apparatus for acquiring a magnetic resonance signal from a target by means of a phase contrast method by use of a static magnetic field, a high frequency magnetic field, a slice gradient magnetic field, a phase encode gradient magnetic field, a readout gradient magnetic field, and a flow encode gradient magnetic field characterized by comprising a gradient magnetic field application means in which a flow encode gradient magnetic field having the first half and the second half in which the gradient of the respective halves is reversed and having an equal absolute value of the gradient is applied in the direction of the readout gradient magnetic field in a time period coincident with the time period when the spin of the target is rephased by means of the slice gradient magnetic field and, a flow encode gradient magnetic field having the first half and the second half in which the gradient of the respective halves is reversed and having an equal absolute value of the gradient is applied in the direction of the slice gradient magnetic field in a time period coincident with the time period when the spin of the target is dephased by means of the readout gradient magnetic field.

In the invention of this aspect, the flow encode gradient magnetic field is converted to a gradient magnetic field having the first half and the second half that have the gradient direction opposite to each other and that have the same absolute gradient value, and the spin is applied to the readout gradient magnetic field direction in a time period coincident with the rephase time period by means of the slice gradient magnetic field, and the flow encode gradient magnetic field is converted to a gradient magnetic field having the first half and the second half that have the gradient direction opposite to each other and that have the same absolute gradient value, and the spin is applied to the slice gradient magnetic field direction in a time period coincident with the dephase time period by means of the readout gradient magnetic field, and as the result the Maxwell term can be reduced to 0.

(8) An another aspect of the invention to be applied to solve the abovementioned problem involves a magnetic resonance signal acquisition apparatus described in any one of (5) to (7) characterized by comprising a gradient magnetic field application means in which the first half of a flow encode gradient magnetic field having the first half and the second half in which the gradient of the respective halves is reversed and having an equal absolute value of the gradient is applied in the direction of the phase encode gradient magnetic field in the time period coincident with the time period when the spin of the target is rephased by means of the slice gradient magnetic field and, the second half of a flow encode gradient magnetic field having the first half and the second half in which the gradient of the respective halves is reversed and having an equal absolute value of the gradient is applied in the direction of the phase encode gradient magnetic field in the time period coincident with the time period when the spin of the target is dephased by means of the readout gradient magnetic field.

In the invention of this aspect, in addition to the abovementioned (5) to (7), the first half of a flow encode gradient magnetic field having the first half and second half in which the gradient of the respective halves is reversed and having an equal absolute value of the gradient is applied in the direction of the phase encode gradient magnetic field in the time period coincident with the time period when the spin is rephased by means of the slice gradient magnetic field, and the second half of a flow encode gradient magnetic field having the first half and the second half in which the gradient of the respective halves is reversed and having an equal absolute value of the gradient is applied in the direction of the phase encode gradient magnetic field in the time period coincident with the time period when the spin of the target is dephased by means of the readout gradient magnetic field, as the result the Maxwell term is reduced to a small value.

(9) An another aspect of the invention to be applied to solve the abovementioned problem involves a magnetic resonance signal acquisition apparatus for acquiring a magnetic resonance signal from a target by means of a phase contrast method by use of a static magnetic field, a high frequency magnetic field, a slice gradient magnetic field, a phase encode gradient magnetic field, a readout gradient magnetic field, and a flow encode gradient magnetic field and for structuring an image based on the acquired magnetic resonance signal, characterized by comprising a gradient magnetic field application means in which a flow encode gradient magnetic field having the first half and the second half in which the gradient of the respective halves is reversed and having an equal absolute value of the gradient is applied in the direction of the readout gradient magnetic field in a time period coincident with the time period when the spin of the target is rephased by means of the slice gradient magnetic field.

In the invention of this aspect, the flow encode gradient magnetic field is converted to a gradient magnetic field having the first half and the second half that have the gradient direction opposite to each other and that have the same absolute gradient value, and the spin is applied to the readout gradient magnetic field direction in a time period coincident with the rephase time period by means of the slice gradient magnetic field, and as the result the Maxwell term can be reduced to 0. By doing the above, a flow image without a residual image can be obtained.

(10) An another aspect of the invention to be applied to solve the abovementioned problem involves a magnetic resonance signal acquisition apparatus for acquiring a magnetic resonance signal from a target by means of a phase contrast method by use of a static magnetic field, a high frequency magnetic field, a slice gradient magnetic field, a phase encode gradient magnetic field, a readout gradient magnetic field, and a flow encode gradient magnetic field and for structuring an image based on the acquired magnetic resonance signal, characterized by comprising a gradient magnetic field application means in which a flow encode gradient magnetic field having the first half and the second half in which the gradient of the respective halves is reversed and having an equal absolute value of the gradient is applied in the direction of the slice gradient magnetic field in a time period coincident with the time period when the spin of the target is dephased by means of the readout gradient magnetic field.

In the invention of this aspect, the flow encode gradient magnetic field is converted to a gradient magnetic field having the first half and the second half that have the gradient direction opposite to each other and that have the same absolute gradient value, and the spin is applied to the slice gradient magnetic field direction in a time period coincident with the dephase time period by means of the readout gradient magnetic field, and as the result the Maxwell term can be reduced to 0. By doing the above, a flow image without a residual image can be obtained.

(11) An another aspect of the invention to be applied to solve the abovementioned problem involves a magnetic resonance signal acquisition apparatus for acquiring a magnetic resonance signal from a target by means of a phase contrast method by use of a static magnetic field, a high frequency magnetic field, a slice gradient magnetic field, a phase encode gradient magnetic field, a readout gradient magnetic field, and a flow encode gradient magnetic field and for structuring an image base on the acquired magnetic resonance signal, characterized by comprising a gradient magnetic field application means in which a flow encode gradient magnetic field having the first half and the second half in which the gradient of the respective halves is reversed and having an equal absolute value of the gradient is applied in the direction of the readout gradient magnetic field in a time period coincident with the time period when the spin of the target is rephased by means of the slice gradient magnetic field, and a flow encode gradient magnetic field having the first half and the second half in which the gradient of the respective halves is reversed and having an equal absolute value of the gradient is applied in the direction of the slice gradient magnetic field in a time period coincident with the time period when the spin of the target is dephased by means of the readout gradient magnetic field.

In the invention of this aspect, the flow encode gradient magnetic field is converted to a gradient magnetic field having the first half and the second half that have the gradient direction opposite to each other and that have the same absolute gradient value, and the spin is applied to the readout gradient magnetic field direction in a time period coincident with the rephase time period by means of the slice gradient magnetic field, and the flow encode gradient magnetic field is converted to a gradient magnetic field having the first half and the second half that have the gradient direction opposite to each other and that have the same absolute gradient value, and the spin is applied to the slice gradient magnetic field direction in a time period coincident with the dephase time period by means of the readout gradient magnetic field, and as the result the Maxwell term can be reduced to 0. By doing the above, a flow image without a residual image can be obtained.

(12) An another aspect of the invention to be applied to solve the abovementioned problem involves a magnetic resonance signal acquisition apparatus as described in any one of the abovementioned (9) to (11) characterized comprising a gradient magnetic field application means in which the first half of a flow encode gradient magnetic field having the first half and the second half in which the gradient of the respective halves is reversed and having an equal absolute value of the gradient is applied in the direction of the phase encode gradient magnetic field in the time period coincident with the time period when the spin of the target is rephased by means of the slice gradient magnetic field, and the second half of a flow encode gradient magnetic field having the first half and the second half in which the gradient of the respective halves is reversed and having an equal absolute value of the gradient is applied in the direction of the phase encode gradient magnetic field in the time period coincident with the time period when the spin of the target is dephased by means of the readout gradient magnetic field.

In the invention of this aspect, in addition to any one of the abovementioned (1) to (3), the first half of a flow encode gradient magnetic field having the first half and the second half in which the gradient of the respective halves is reversed and having an equal absolute value of the gradient is applied in the direction of the phase encode gradient magnetic field in the time period coincident with the time period when the spin is rephased by means of the slice gradient magnetic field, and the second half of a flow encode gradient magnetic field having the first half and the second half in which the gradient of the respective halves is reversed and having an equal absolute value of the gradient is applied in the direction of the phase encode gradient magnetic field in the time period coincident with the time period when the spin of the target is dephased by means of the readout gradient magnetic field, as the result the Maxwell term is reduced to a small value. By doing the above, a flow image with a very slight residual image can be obtained.

According to the present invention, a method and an apparatus that acquire a magnetic resonance signal with a small Maxwell term is realized, and a magnetic resonance imaging apparatus provided with such a magnetic resonance signal acquisition apparatus is realized.

Further objects and advantages of the present invention will be apparent from the following description of the preferred embodiments of the invention as illustrated in the accompanying drawings.

BRIEF DESCRIPTION OF THE DRAWINGS

FIG. 7 is a diagram showing exemplary flow encode according to a pulse sequence shown in FIG. 3 to FIG. 6.

DETAILED DESCRIPTION OF THE INVENTION

Figure 1:
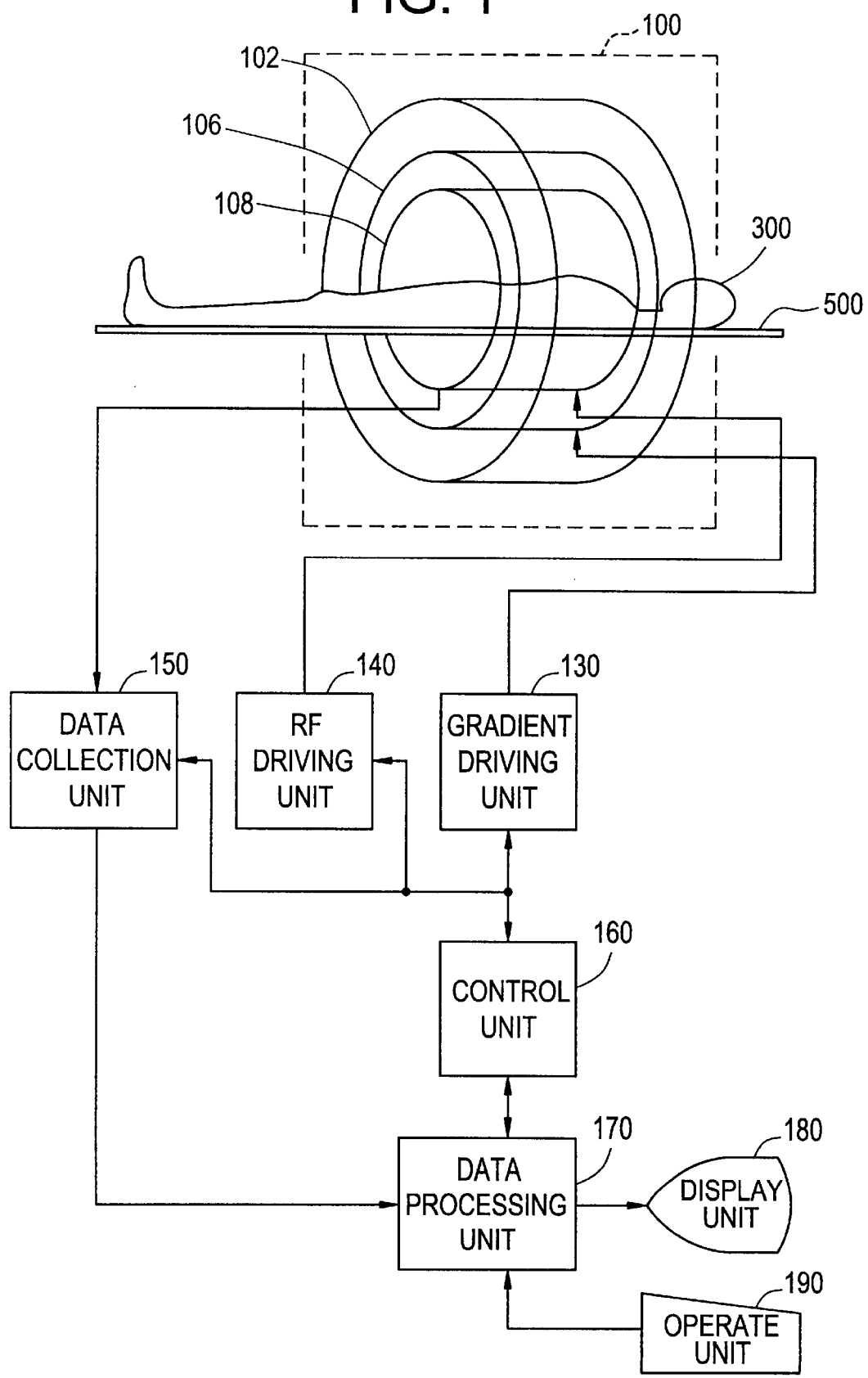
FIG. 1 is a block diagram of an exemplary apparatus of an embodiment of the present invention.

Embodiments of the present invention will be described in detail hereinafter with reference to the drawings. FIG. 1 shows a block diagram of a magnetic resonance imaging apparatus. This apparatus is an exemplary embodiment of the present invention. The structure of the present apparatus shows one example of an embodiment in accordance with an apparatus of the present invention. The operation of the apparatus will show an example of the embodiment in accordance with the method of the present invention.

The present apparatus is provided with a magnet system 100 as shown in FIG. 1. The magnet system 100 has a main magnetic field coil unit (coil) 102, a gradient coil unit 106, and an RF (radio frequency) coil 108. These coils are all approximately cylinder-shaped, and located coaxially. An imaging target 300 that has been placed on a cradle 500 is carried in to or out from the approximately cylindrical internal bore of the magnet system 100 by means of a carrier not shown in the drawing.

The main magnet field coil unit 102 forms a static magnetic field in the internal bore of the magnet system 100. The direction of the static magnetic field is approximately parallel to the direction of the body axis of the target 300. In other words, the main magnetic field coil unit 102 forms a so-called horizontal magnetic field. The main magnetic coil unit 102 is formed of, for example, a superconducting magnet coil. As a matter of course, a resistive type conducting magnet may be used instead of the superconducting magnet coil.

The gradient coil unit 106 generates a gradient magnetic field to incline the static magnetic field. The generated gradient magnetic field includes three gradient magnetic fields, namely a slice gradient magnetic field, a phase encode gradient magnetic field, and a readout gradient magnetic field. The gradient coil unit 106 has three series of gradient coil units not shown in the drawing corresponding to respective three gradient magnetic fields. The gradient magnetic field is simply referred to as the gradient depending on the case hereinafter.

The three magnetic fields of three types give the gradient to the static magnetic field intensity in the three directions perpendicular each other respectively. This direction is referred to as the direction of the gradient in the present invention. A flow encode gradient magnetic field that will be described hereinafter is a magnetic field having the gradient in three directions, two directions of the three, or one direction of the three.

The RF coil unit 108 forms a high frequency magnetic field that excites the spin in a body of a target 300 in the static magnetic field bore. Forming of a high frequency magnetic field is referred to as transmission of RF exciting signal depending on the case. The RF coil unit 108 receives a magnetic resonance signal, namely the radio wave arising from the excited spin.

The RF coil unit 108 has a transmission coil and a receiving coil though that are not shown in the drawing. A coil is used commonly as the transmission coil and the receiving coil, or two coils are used for the transmission coil and receiving coil respectively.

The gradient coil unit 106 is connected to a gradient driving unit 130. The gradient driving unit 130 provides a driving signal to the gradient coil unit 106 to generate a gradient magnetic field. The gradient driving unit 130 has three series of driving circuits (not shown in the drawing) corresponding to the three series of gradient coil units of the gradient coil unit 106. The part comprising the gradient coil unit 106 and the gradient driving unit 130 shows one embodiment of the gradient magnetic field application means in the present invention.

The RF coil unit 108 is connected to the RF driving unit 140. The RF driving unit 140 supplies a driving signal to the RF coil unit 108 to transmit an RF excitation signal, and the spin in the body of the target 300 is excited.

The RF coil unit 108 is connected to a data collection unit 150. The data collection unit 150 takes in the signal received from the RF coil unit 108 and collects it as the view data.

The gradient driving unit 130, RF driving unit 140, and data collection unit 150 are connected to a control unit 160. The control unit 160 controls the gradient driving unit 130, RF driving unit 140, and data collection unit 150 to perform imaging.

The part comprising the magnet system 100, gradient driving unit 130, RF driving unit 140, data collection unit 150, and control unit 160 shows an exemplary embodiment of the magnetic resonance signal acquisition apparatus of the present invention. An exemplary embodiment in accordance with the apparatus of the present invention is shown referring to the structure of the present apparatus. An exemplary embodiment in accordance with the method of the present invention is shown referring to the operation of the present apparatus.

The output side of the data collection unit 150 is connected to a data processing unit 170. The data processing unit 170 comprises, for example, a computer or the like. The data processing unit 170 has a memory though it is not shown in the drawing. The memory stores a program for the data processing unit 170 and various data. The function of the present apparatus is realized when the data processing unit 170 executes the program stored in the memory.

The data processing unit 170 stores the data taken in from the data collection unit 150. A data space is formed in the memory. The data space constitutes a two-dimensional Fourier space. The data processing unit 170 subjects the data in the two-dimensional Fourier space to two-dimensional inverse Fourier transformation and then generates (restructures) an image of the target 300. The two-dimensional Fourier space is referred to as k-space in some cases.

The data processing unit 170 is connected to the control unit 160. The data processing unit 170 is ranked at the higher position than the control unit 160 and controls the control unit 160. The data processing unit 170 is connected to a display unit 180 and an operation unit 190. The display unit 180 comprises a graphic display. The operation unit 190 comprises a keyboard having a pointing device.

The display unit 180 displays restructured images and various information supplied from the data processing unit 170. The operation unit 190 is operated by operators and is used to enter various commands and information to the data processing unit 170. An operator can operate the present apparatus interactively through the display unit 180 and operation unit 190.

Figure 2:
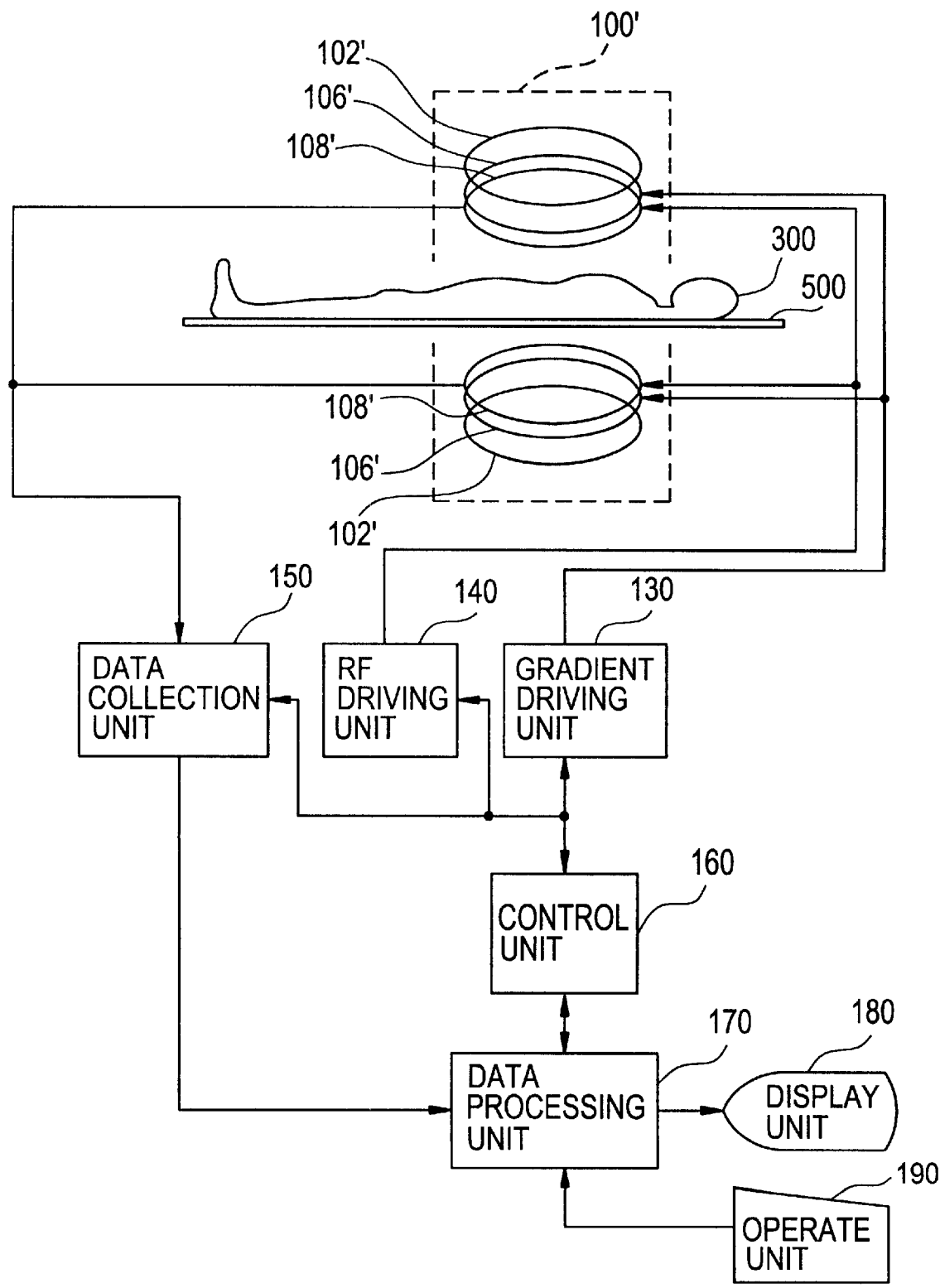
FIG. 2 is a block diagram of another exemplary apparatus of an embodiment of the present invention.

FIG. 2 is a block diagram of a magnetic resonance imaging apparatus of anther type. The present apparatus is an exemplary embodiment of the present invention. The structure of the present apparatus shows one example of an embodiment in accordance with an apparatus of the present invention. The operation of the apparatus will show an example of the embodiment in accordance with the method of the present invention.

The apparatus shown in FIG. 2 has a magnet system 100' that is different in the system from the apparatus shown in FIG. 1. The apparatus shown in FIG. 2 has the same structure as that of the apparatus shown in FIG. 1 excepting the magnet system 100', and the same components of the apparatus as those of the apparatus shown in FIG. 1 are given the same numerals and the description is omitted.

The magnet system 100' comprises a main magnet field magnet unit 102', a gradient coil unit 106', and an RF coil unit 108'. The main magnet field magnet unit 102' and the set of coils are paired with interposition of a space that are placed opposite to each other. These components are approximately disk-shaped and disposed coaxially having the common center axis. An imaging target 300 that has been placed on a cradle 500 is carried in to or out from the approximately cylindrical internal bore of the magnet system 100' by means of a carrier not shown in the drawing.

The main magnetic field unit 102' forms a static magnetic field in the internal bore of the magnetic system 100'. The direction of the static magnetic field is approximately orthogonal to the body axis direction of the target 300. In other words, the main magnetic field magnet unit 102' forms a so-called perpendicular magnetic field. The main magnetic field magnet unit 102' comprises, for example, a permanent magnet. As a matter or course, a resistive type conducting magnet may be used instead of the superconducting magnet coil.

The gradient coil unit 106' generates a gradient magnetic field to incline the static magnetic field. The generated gradient magnetic field includes three gradient magnetic fields, namely a slice gradient magnetic field, a phase encode gradient magnetic field, and a readout gradient magnetic field. The gradient coil unit 106' has three series gradient coil units not shown in the drawing corresponding to respective three gradient magnetic fields. The part comprising the gradient coil unit 106' and the gradient driving unit 130 shows an example of the gradient magnetic field application means in the present invention.

The RF coil unit 108' transmits an RF excitation signal that is served to excite the spin in the body of the target 300 to the static magnetic field bore. Furthermore, the RF coil unit 108' receives a magnetic field resonance signal that has been generated from the excited spin. The RF coil unit 108' has a transmission coil and a receiving coil though they are not shown in the drawing. A coil may be used commonly as the transmission coil and the receiving coil, or two coils may be used as the transmission coil and receiving coil respectively.

The part comprising the magnet system 100', gradient driving unit 130, RF driving unit 140, data collection unit 150, and control unit 160 is one embodiment of a magnetic resonance signal acquisition apparatus of the present invention. The structure of the present apparatus shows one exemplary embodiment in accordance with the apparatus of the present invention. The operation of the present apparatus shows one exemplary embodiment in accordance with the method of the present invention.

Figure 3:
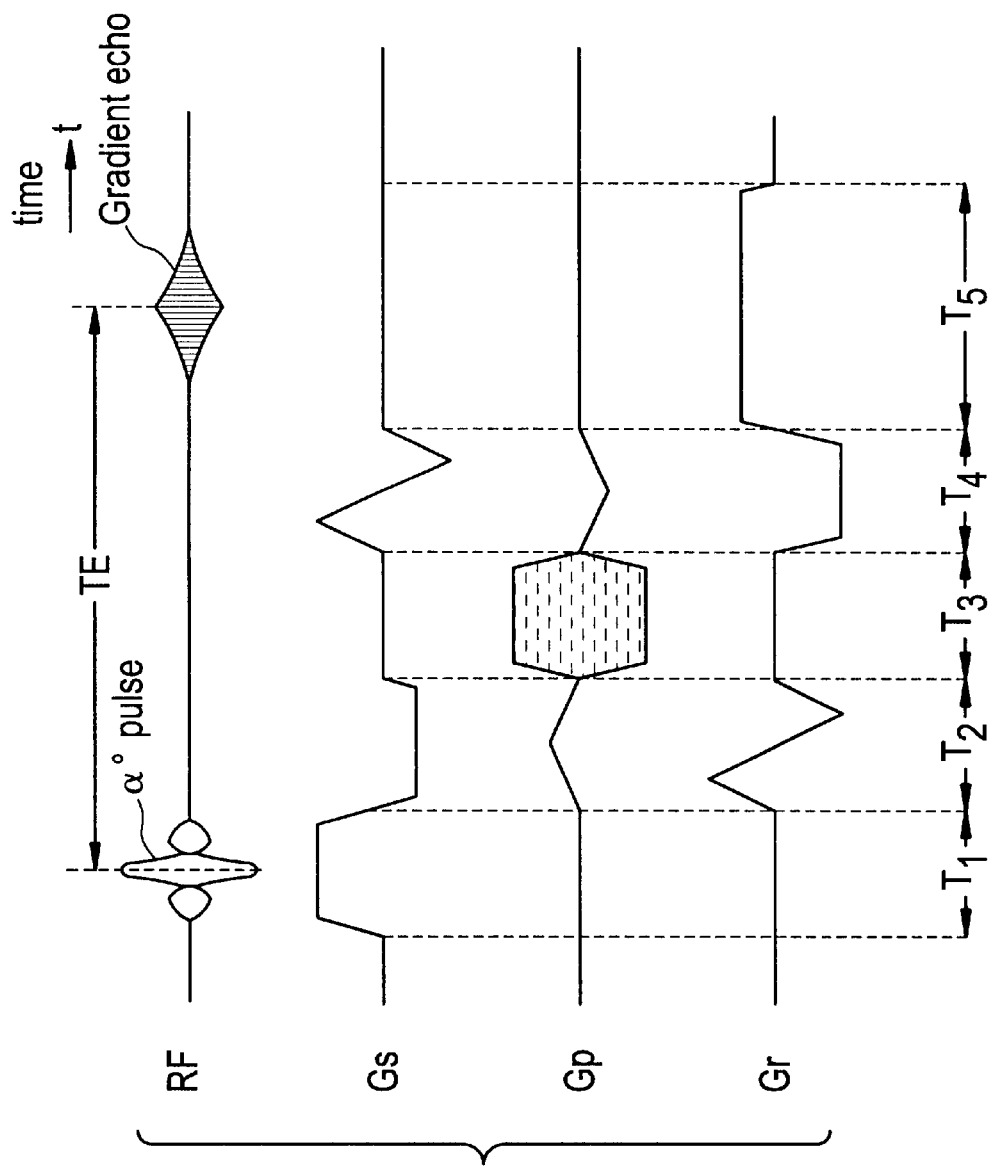
FIG. 3 is a diagram showing an exemplary pulse sequence that is executed by an apparatus shown in FIG. 1 or FIG. 2.

FIG. 3 shows an example of a pulse sequence used for magnetic resonance imaging. The pulse sequence is a pulse sequence based on the phase contrast method. In FIG. 3, the abscissa represents the time and the ordinate represents the signal intensity. In FIG. 3, a pulse sequence is divided into five time periods from T1 to T5 along the ordinate for convenience.

(1) in FIG. 3 shows sequences of an RF signal, and shows the sequences of α degree pulse, namely RF excitation signal, and a gradient echo. (2), (3), and (4) shows sequences of a slice gradient Gs, a phase encode gradient Gp, and a readout gradient Gr.

The sequence of the slice gradient Gs has a signal waveform that is served to generate the gradient for slice selection in the time period T1, and has a signal waveform that is served to generate the gradient for rephasing of the spin phase in the time period T2. The signal waveform is, for example, a trapezoid waveform.

The sequence of the slice gradient Gs has a signal waveform that is served to generate the flow encode gradient in the time period T4. For example, a triangle waveform, in which an integral value is 0, is used as the signal waveform. However, the signal waveform is by no means limited to the triangle wave, and any wave in which the integral value in a time period is 0 such as a sawtooth wave, a rectangular wave, a trapezoidal wave, or a sine wave may be used as the signal waveform.

By using a signal having the waveform as described hereinabove, the flow encode gradient containing the first half and the second half having the same gradient absolute value in which the direction of the first half gradient is opposite to the direction of the second half in a time period is formed.

When the flow encode gradient as described hereinabove is used, the phase of a spin that moves along the direction of the slice gradient Gs deviates from the original phase with the positional change because magnetic fields having different intensities between the first half and the second half of a gradient application time period act in the opposite direction. In other words, flow encode of a spin is performed. The flow encode is served as the flow encode of the slice gradient direction component of the travel distance of the spin.

The sequence of the phase encode gradient Gp has the signal waveform that is served to generate the gradient for phase encoding of the spin in the time period T3. The signal waveform is, for example, a trapezoidal waveform. The amplitude of the trapezoidal waveform is changed periodically. The amplitude change is shown with a broken line.

The sequence of the phase encode gradient Gp has signal waveforms that are served to generate the flow encode gradient in the time periods T2 and T4. The signal waveform in the time period T2 is the first half of the triangle wave and the signal waveform in the time period T4 is the second half of the triangle wherein the integral value of the signal waveforms in T2 and T4 is 0. As a matter of course, the waveform is by no means limited to the triangle wave.

When the waveform as described hereinabove is used, the phase of a spin that moves along the direction of the phase encode gradient Gp deviates from the original phase with the positional change because magnetic fields having different intensities between the first half and the second half of a gradient application time period act in the opposite direction. In other words, flow encode is performed. The flow encode is served as the flow encode of the phase encode gradient direction component of the travel distance of the spin.

The sequence of the readout gradient Gr has a waveform that is served to generate the gradient for dephasing the spin in the time period T4, and has a signal waveform that is served to generate the gradient for generating the gradient echo by rephasing and dephasing the spin in the time period T5. The signal waveform is, for example, a trapezoidal waveform.

The sequence of the readout gradient Gr has a signal waveform that is served to generate a flow encode gradient in the time period T2. For example, the triangle wave, in which the integral value in the time period is 0, is used as the signal waveform. As a matter of course, the waveform is by no means limited to the triangle wave.

When the waveform as described hereinabove is used, the phase of a spin that moves along the direction of the readout gradient Gr deviates from the original phase with the positional change because magnetic fields having different intensities between the first half and the second half of a gradient application time period act in the opposite direction. In other words, flow encode is performed. The flow encode is served as the flow encode of the readout gradient direction component of the travel distance of the spin.

The magnetic resonance imaging that involves the pulse sequence as described hereinbefore is performed as described hereinafter. At first, the slice gradient Gs is applied in the time period T1, α degree pulse is applied in the application time period to select and excite a spin, and the flip angle of the spin is α degrees. α degree is equal to or lower than 90 degrees.

Next, the spin is rephased in the time period T2 by means of the slice gradient Gs. In this time period, the travel distance of the spin in the phase encode gradient direction is subjected to the first half portion of the flow encode by means of the first half of the flow encode gradient that is added to the sequence of the phase encode gradient Gp. Furthermore, the travel distance of the spin in the readout gradient direction is subjected to flow encode by means of the flow encode gradient that is added to the sequence of the readout gradient Gr.

Next, the spin is subjected to phase encode by means of the phase encode gradient Gp in the time period T3.

Next, the spin is subjected to spin dephasing by means of the readout gradient Gr in the time period T4. At that time, the travel distance of the spin in the phase encode gradient direction is subjected to the second half portion of the flow encode by means of the second half of the flow encode gradient that is added to the sequence of the phase encode gradient Gp. Furthermore, the travel distance of the spin in the slice gradient direction is subjected to flow encode by means of the flow encode gradient that is added to the sequence of the slice gradient Gs.

Next, in the time period T5, the spin is rephased by means of the readout gradient Gr and is dephased subsequently, and a gradient echo is generated. The signal intensity of the gradient echo attains to the maximum value at the time point after the echo time from the α degree excitation. The gradient echo is collected by the data collection unit 150 as the view data.

The pulse sequence is repeated with a repetition time TR.

Figure 4:
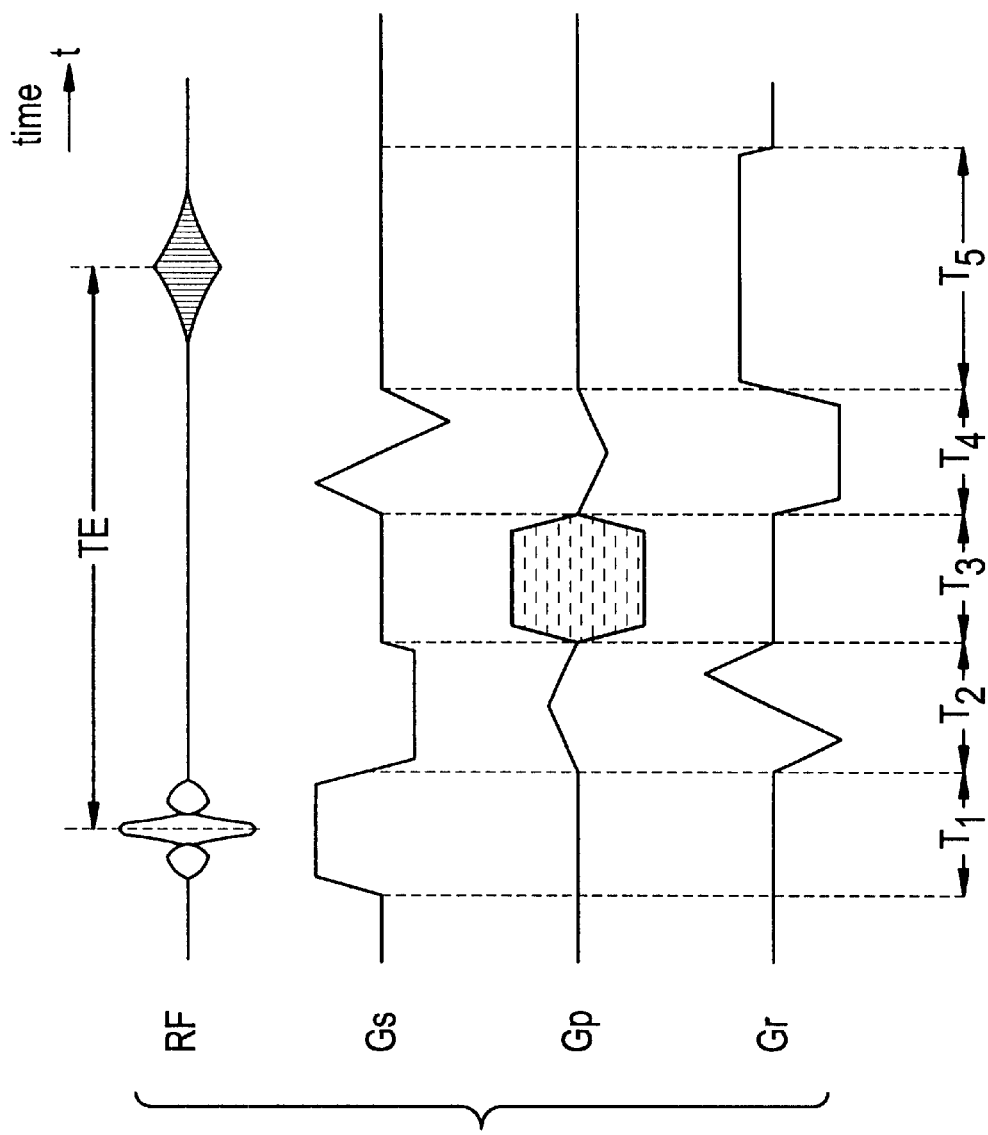
FIG. 4 is a diagram showing another exemplary pulse sequence that is executed by an apparatus shown in FIG. 1 or FIG. 2.

FIG. 4 shows a pulse sequence in the next repetition time. The pulse sequence shown in FIG. 4 is the same as that shown in FIG. 3 excepting the signal waveform of the flow encode gradient in the time period T2 that is added to the sequence of the readout gradient Gr. The amplitude of the phase encode gradient Gp is also the same as that shown in FIG. 3.

The phase of the signal waveform of the flow encode gradient in the time period T2 that is added to the sequence of the readout gradient Gr is inverse to that shown in FIG. 3. As the result, the phase of the spin having the travel component in the readout gradient direction is changed in the reverse direction to the direction that is shown in FIG. 3. In other words, the reverse polar flow encode is performed.

The gradient echo to which such flow encode is added is collected as the view data. The same phase encode gradient Gp that is used for both cases results in the same phase encode, and the data shows the same view as that shown in FIG. 3 excepting that the flow encode to the flow in the readout gradient direction is reverse in the polarity.

Figure 5:
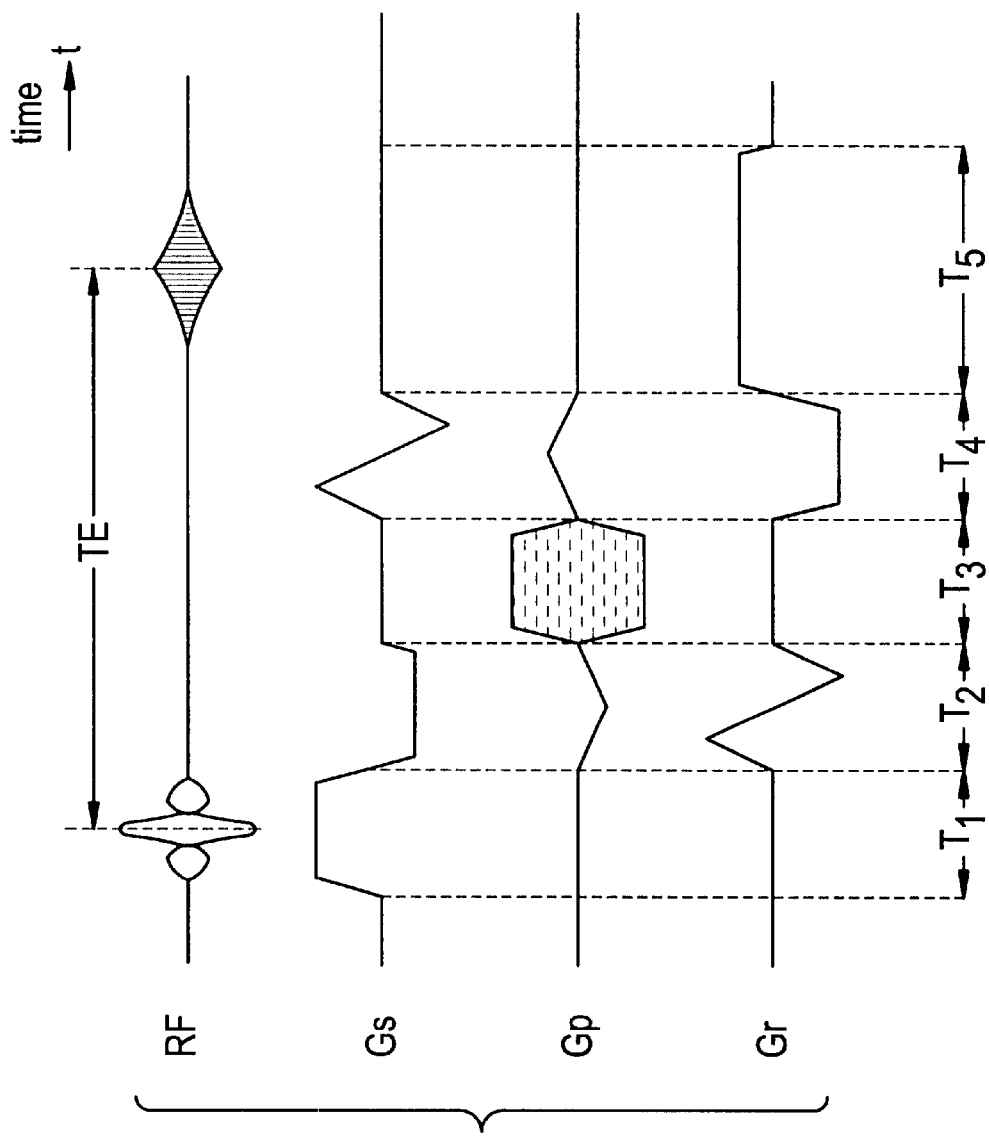
FIG. 5 is a diagram showing another exemplary pulse sequence that is executed by an apparatus shown in FIG. 1 or FIG. 2.

FIG. 5 shows a pulse sequence in the next repetition time. The pulse sequence shown in FIG. 5 is the same as that shown in FIG. 3 excepting the signal waveform of the flow encode gradient in the time periods T2 and T4 that is added to the sequence of the phase encode gradient Gp. The amplitude of the phase encode gradient Gp is also the same as that shown in FIG. 3.

The phase of the signal waveform of the flow encode in the time periods T2 and T4 that is added to the sequence of the phase encode gradient Gp is reverse to the phase shown in FIG. 3. As the result, the spin having the travel component in the phase encode gradient direction is subjected to flow encode in the polarity that is reverse to the polarity shown in FIG. 3.

The gradient echo to which such flow encode is added is collected as the view data. The same phase encode gradient Gp results in the data of the same view as that obtained in FIG. 3. However, the flow encode to the flow in the phase encode gradient direction is reverse in the polarity.

Figure 6:
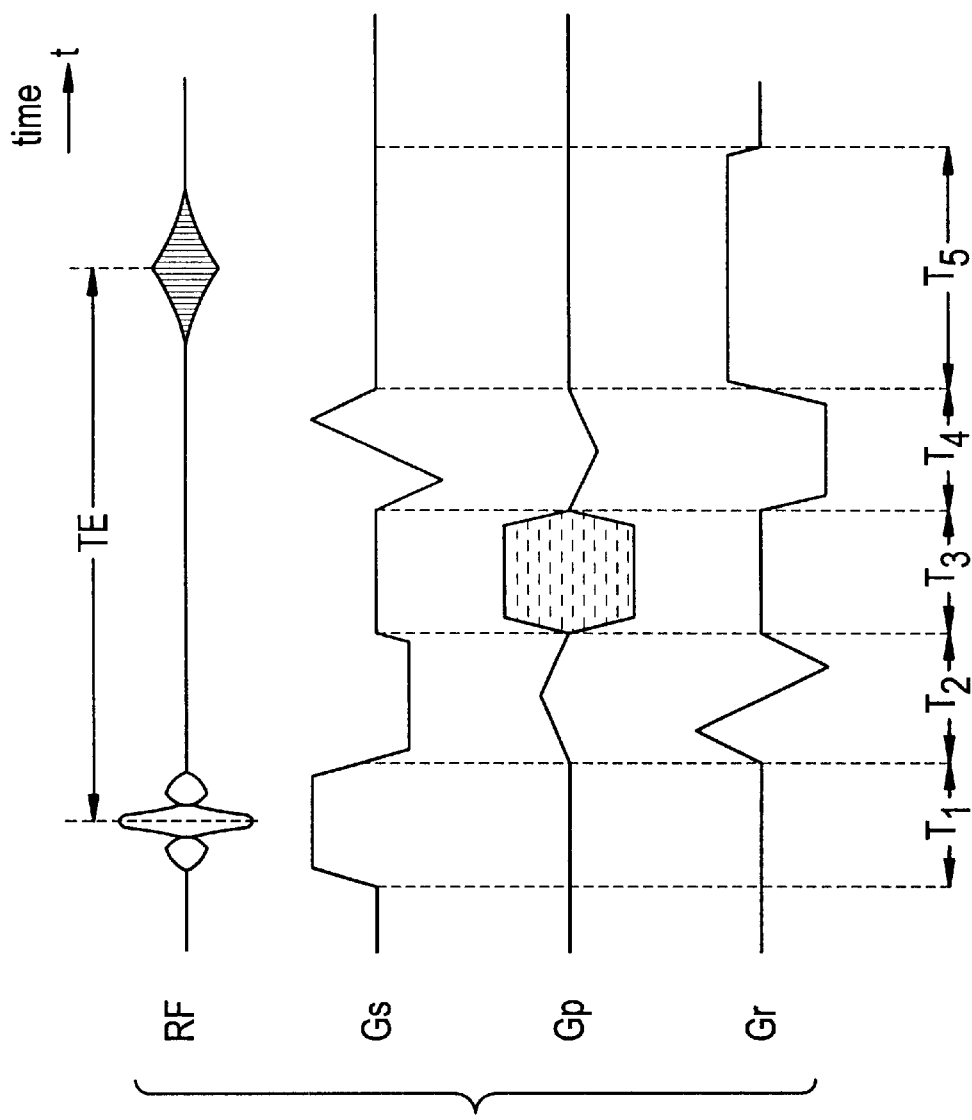
FIG. 6 is a diagram showing another exemplary pulse sequence that is executed by an apparatus in FIG. 1 or FIG. 2.

FIG. 6 shows the pulse sequence in the next repetition time. The pulse sequence in FIG. 6 is the same as that shown in FIG. 3 excepting the signal waveform of the flow encode in the time period 4 that is added to the sequence of the slice gradient Gs. Furthermore, the amplitude of the phase encode gradient Gp is the same as that shown in FIG. 3.

The phase of the signal waveform of the flow encode gradient in the time period T4 that is added to the sequence of the slice gradient Gs is reverse to that shown in FIG. 3. As the result, the spin having the travel component in the slice gradient direction is subjected to flow encode in the polarity that is reverse to the polarity in the case of FIG. 3.

The gradient echo to which such flow encode is added is collected as the view data. The same phase encode gradient Gp used herein results in the data of the same view as obtained in the case of FIG. 3. However, the flow encode to the flow in the slice gradient direction is reverse in the polarity.

The spin that travels in three gradient directions perpendicular to each other is subjected to flow encode in both positive and negative polarity. The relation between the pulse sequence of respective figures and the flow encode polarity in the respective gradient directions is shown in FIG. 7. + represents the positive polarity and − represents the negative polarity in FIG. 7.

The flow encode gradient for flow encode in both positive and negative polarity forms a pair. In detail, the flow encode gradient in the time period T2 that is added to the sequence of the readout gradient Gr shown in FIG. 3 forms a pair with the flow encode gradient in the time period T2 that is added to the sequence of the readout gradient Gr shown in FIG. 4.

Similarly, the flow encode gradient in the time periods T2 and T4 that is added to the sequence of the phase encode gradient Gp shown in FIG. 3 forms another pair with the flow encode gradient in the time periods T2 and T4 that is added to the sequence of the phase encode gradient Gp shown in FIG. 5.

Further similarly, the flow encode gradient in the time period T4 that is added to the sequence of the slice gradient Gs shown in FIG. 3 forms another pair with the flow encode gradient in the time period T4 that is added to the sequence of the slice gradient Gs shown in FIG. 6.

The data processing unit 170 calculates the difference between the gradient echo obtained from the pulse sequence shown in FIG. 3 and the gradient echo obtained from the pulse sequence shown in FIG. 4. As the result of the calculation of the difference, only the signal that is subjected to the flow encode reversely to each other, namely only the signal that involves the spin having the travel component in the readout gradient direction, remains residual, and others are offset. As the result, one view magnetic resonance signal that involves the spin having the travel component in the readout gradient direction is obtained.

Furthermore, the data processing unit 170 calculates the difference between the gradient echo obtained from the pulse sequence shown in FIG. 3 and the gradient echo obtained from the pulse sequence shown in FIG. 5. As the result of the calculation of the difference, only the signal that is subjected to the flow encode reversely to each other, namely only the signal that involves the spin having the travel component in the phase encode gradient direction, remains residual, and others are offset. As the result, one view magnetic resonance signal that involves the spin having the travel component in the phase encode gradient direction.

Furthermore, the data processing unit 170 calculates the difference between the gradient echo obtained from the pulse sequence shown in FIG. 3 and the gradient echo obtained from the pulse sequence shown in FIG. 6. As the result of one calculation of the difference, only the signal that is subjected to flow encode reversely to each other, namely only the signal that involves the spin having the travel component in the slice gradient direction, remains residual, and others are offset. As the result, one view magnetic resonance signal that involves the spin having the travel component in the slice gradient direction is obtained.

The phase of the gradient echo caused from the spin of no positional change also changes based on Maxwell term by means of the flow encode gradient. The phase change occurs depending on the one and the other of the flow encode gradient pair. The phase change difference is given by the following equation that includes Maxwell term.

$$\phi_M(x,y,z)=Az^2+B(x^2+y^2)+Cxz+Dyz \quad (1)$$

Wherein x, y, and z are the coordinate of the three-dimensional rectangular coordinate system in the static magnetic field bore. z is assigned to the static magnetic field. The original point of the coordinate is located at the center of the static magnetic field bore, namely the magnet center.

In the equation (1), A, B, C, and D denote coefficients and are given by the respective following equations.

$$A = \frac{\gamma}{2B_0}\int \{(Gx(t)^2 + Gy(t)^2)_{fe1} - (Gx(t)^2 + Gy(t)^2)_{fe2}\}dt \quad (2)$$

$$B = \frac{\gamma}{8B_0}\int \{(Gz(t)^2)_{fe1} - (Gz(t)^2)_{fe2}\}dt \quad (3)$$

$$C = \frac{\gamma}{2B_0}\int \{(Gx(t)\cdot Gz(t))_{fe1} - (Gx(t)\cdot Gz(t))_{fe2}\}dt \quad (4)$$

$$D = \frac{\gamma}{2B_0}\int \{(Gy(t)\cdot Gz(t))_{fe1} - (Gy(t)\cdot Gz(t))_{fe2}\}dt \quad (5)$$

Wherein;
γ denotes the magnetic rotation ratio,
B0 denotes the static magnetic field intensity,
Gx(t) denotes the gradient magnetic field in x-direction,
Gy(t) denotes the gradient magnetic field in y-direction, and
Gz(t) denotes the gradient magnetic field in z-direction.

The suffixes fe1 and fe2 in the equations (2) to (5) denote the one and the other of the flow encode gradient pair. Therefore, Gx(t), Gy(t) and Gz(t) to which the suffix fe1 is added denote the one of the respective flow encode gradient pairs in x-direction, y-direction, and z-direction, Gx(t), Gy(t), and Gz(t) to which the suffix fe2 is added denote the other of the respective flow encode gradient pairs in x-direction, y-direction, and z-direction.

The one of the flow encode gradient pair is referred to as first time flow encode gradient, and the other of the flow encode gradient is referred to as second time flow encode gradient.

For example, on the assumption that the direction of the slice gradient Gs is assigned to z-direction, the direction of the phase encode gradient Gp is assigned to y-direction, and the direction of the readout gradient Gr is assigned to x-direction Gz(t), Gy(t), and Gx(t) correspond to Gs, Gp, and Gr respectively.

The direction of the slice gradient Gs is by no means limited to z-direction, and may be any one of x, y, z-directions. Furthermore, the direction of the phase encode gradient Gp may be any one of residual two directions, and the direction of the readout gradient may be the residual one direction.

Furthermore, the oblique gradient in which the direction of Gs, Gp, and Gr is inclined in x, y, and z-directions respectively may be employed. In this case, Gz(t), Gy(t), and Gx(t) are represented by means of vector synthesis of Gs, Gp, and Gr. An example in which Gz(t), Gy(t) and Gx(t) are correlated to Gs, Gp, and Gr respectively is described hereinafter, however, this is true in other cases as well.

When Gs, Gp, and Gr change as shown in FIG. 3 to FIG. 6, the coefficients A, B, C, and D become 0 or a small value as described hereinafter. As the result, the value of the equation (1) is a small value.

At first the coefficient A will be described. The left half term in {} of the equation (2) represents the sum of squares of the gradient Gx(t) in x-direction and the gradient Gy(t) in y-direction in the first time flow encode. The first time flow encode is performed according to the pulse sequence shown in FIG. 3. Therefore, the square of Gx(t) is equivalent to the square of the triangle wave signal of Gr in the time period T2, and the square of Gy(t) is equivalent to the square of the triangle wave signal of Gp in the time periods T2 and T4.

Furthermore, the right half term in {} represents the sum of squares of the gradient Gx(t) in x-direction and the gradient Gy(t) in y-direction in the second time flow encode. The second time flow encode is performed according to the pulse sequences shown in FIG. 4 and FIG. 5 respectively. Therefore, the square of Gx(t) is equivalent to the square of the triangle wave signal of Gr in the time period T2 shown in FIG. 4, and the square of Gy(t) is equivalent to the square of the triangle wave signal of Gp in the time periods T2 and T4 shown in FIG. 5.

Because only the difference between the first time and the second time of Gr involves the difference in the positive/negative phase, the first time is equalized to the second time by squaring. As the result, the difference between the left half term and the right half term in {} is 0, and the coefficient A is 0.

Next, the coefficient B will be described. The left half term in {} of the equation (3) represents the square of the gradient Gz(t) in z-direction in the first time flow encode. Because the first time flow encode is performed according to the pulse sequence shown in FIG. 3, the square of Gz(t) is equivalent to the square of the triangle wave signal of Gs in the time period T4.

Furthermore, the right half term in {} represents the square of the gradient Gz(t) in z-direction in the second time flow encode. Because the second time flow encode is performed according to the pulse sequence shown in FIG. 6, the square of Gz(t) is equivalent to the square of the triangle wave signal of Gs in the time period T4 in FIG. 6.

Only the difference between the first time and the second time of Gs involves the difference in the positive/negative phase, and the first time is equalized to the second time by squaring. Therefore, the difference between the left half term and the right half term in {} is 0, and the coefficient B is resultantly 0.

Next, the coefficient C will be described. The left half term in {} of the equation (4) represents the product of the gradient Gx(t) in x-direction and the gradient Gz(t) in z-direction in the first time flow encode. Because the first time flow encode is performed according to the pulse sequence shown in FIG. 3, the product of Gx(t) and Gz(t) is equivalent to the product of the trapezoidal wave signal of Gs and the triangle wave signal of Gr in the time period T2 and is equivalent to the product of the triangle wave signal of Gs and the trapezoidal wave signal of Gr in the time period T4.

Furthermore, the left half term in {} represents the product of the gradient Gx(t) in x-direction and the gradient Gz(t) in z-direction in the second time flow encode. Because the second time flow encode is performed according to the pulse sequences shown in FIG. 4 and FIG. 6, the product of Gx(t) and Gz(t) is equivalent to the product of the trapezoidal wave signal of Gs and the triangle wave signal of Gr in the time period T2 in FIG. 4 and the product of the triangle wave signal Gs and the trapezoidal wave signal of Gr in the time period T4. Furthermore, in FIG. 6, the product of Gs and Gr is equivalent to the product of the trapezoidal wave signal of Gs and the triangle wave signal of Gr in the time period T2 and the product of the triangle wave signal of Gs and the trapezoidal wave signal Gr in the time period T4.

Because Gr is given in the form of the triangle wave signal having the average value of 0 in the time period T2, the product of Gr and Gs given in the form of the trapezoidal wave signal gives the average value of 0 in the time period T2. Furthermore, because Gs is given in the form of the triangle wave signal having the average value of 0 in the time period T4, the product of Gs and Gr given in the form of the trapezoidal wave signal gives the average value of 0 in the time period T4. That is true for the first time and the second time as well. Therefore, the coefficient C that is given in the form of the integration of the values in {} is 0.

Next, the coefficient D will be described. The left half term in {} of the equation (5) represents the product of the gradient Gy(t) in y-direction and the gradient Gz(t) in z-direction in the first time flow encode. Because the flow time flow encode is performed according to the pulse sequence shown in FIG. 3, the product of Gy(t) and Gz(t) is equivalent to the product of the first half portion of the triangle wave signal of Gp and the trapezoidal wave signal of Gs in the time period T2, and the product of the second half portion of the triangle wave signal of Gp and the triangle wave signal of GS in the time period T4.

Furthermore, the left half in {} represents the product of the gradient Gy(t) in y-direction and the gradient Gz(t) in z-direction in the second time flow encode. Because the second time flow encode is performed according to the pulse sequences shown in FIG. 5 and FIG. 6, the product of Gy(t) and Gz(t) is equivalent to the product of the first half portion of the triangle wave signal of Gp and the trapezoidal wave signal of Gs in the time period T2, and the product of the second half portion of the triangle wave signal of Gp and the triangle wave signal of Gs in the time period T4 in FIG. 5. Furthermore, in FIG. 6, the product of Gp and Gs is equivalent to the product of the first half portion of the triangle wave signal of Gp and the trapezoidal wave signal of Gs in the time period T2, and the product of the second half portion of the triangle wave signal of Gp and the triangle wave signal of Gs in the time period T4.

Because Gs is given in the form of the triangle wave signal having the average value of 0 in the time period T4, the product of Gs and Gp that is given in the form of a half of the triangle wave signal gives the average value of 0 in the time period T4. That is true for the first time and the second time as well. Therefore, the integration gives 0, and the coefficient D is not affected.

On the other hand, because Gp that forms the first half portion of the triangle wave signal is opposite in the sign between the first time and the second time in the time period T2, the product of Gp and Gs that is the trapezoidal wave is opposite in the sign between the first time and the second time, the value in {} is not 0, and the coefficient D is not 0 resultantly.

However, because one repetition time signal of Gp is applied over the first half and second half, the signal intensity of half is sufficient to realize the same flow encode magnitude as that in different directions. As the result, the value of the coefficient D is a small value.

Three coefficients are 0 and the residual one coefficient has a small value out of four coefficients A, B, C, and D, and the phase represented by the equation (1) has a small value resultantly. The fact that the value is small means that the phase change of the gradient echo obtained from the static portion is approximately equal between the first time flow encode and the second time flow encode, and the phase chance can be offset substantially by calculating the difference. In other words, the signal that causes residue can be removed substantially.

The same data collection operation as described hereinbefore is repeated, for example, 64 to 512 times with changing the phase encode gradient Gp successively with application of the pulse sequence that includes the pulse sequences shown in FIG. 3 to FIG. 6 as one set. Three sets of view data of 64 to 512 views that fill the k-space are obtained by doing the abovementioned operation.

The data processing unit 170 restructures the respective images based on three set view data to obtain three tomographic images. These tomographic images show the spin flow component in three directions that are perpendicular to each other. The data processing unit 170 extracts the square root of the sum of squares from three images for each same pixel, and structures an image of the pixel value having the values. The image is a flow image that represents equally the spin flow in the slice plane regardless of the direction.

The flow encode is performed in three directions as described hereinabove, however, the flow encode may be performed in arbitrary two directions instead.

Figure 8:
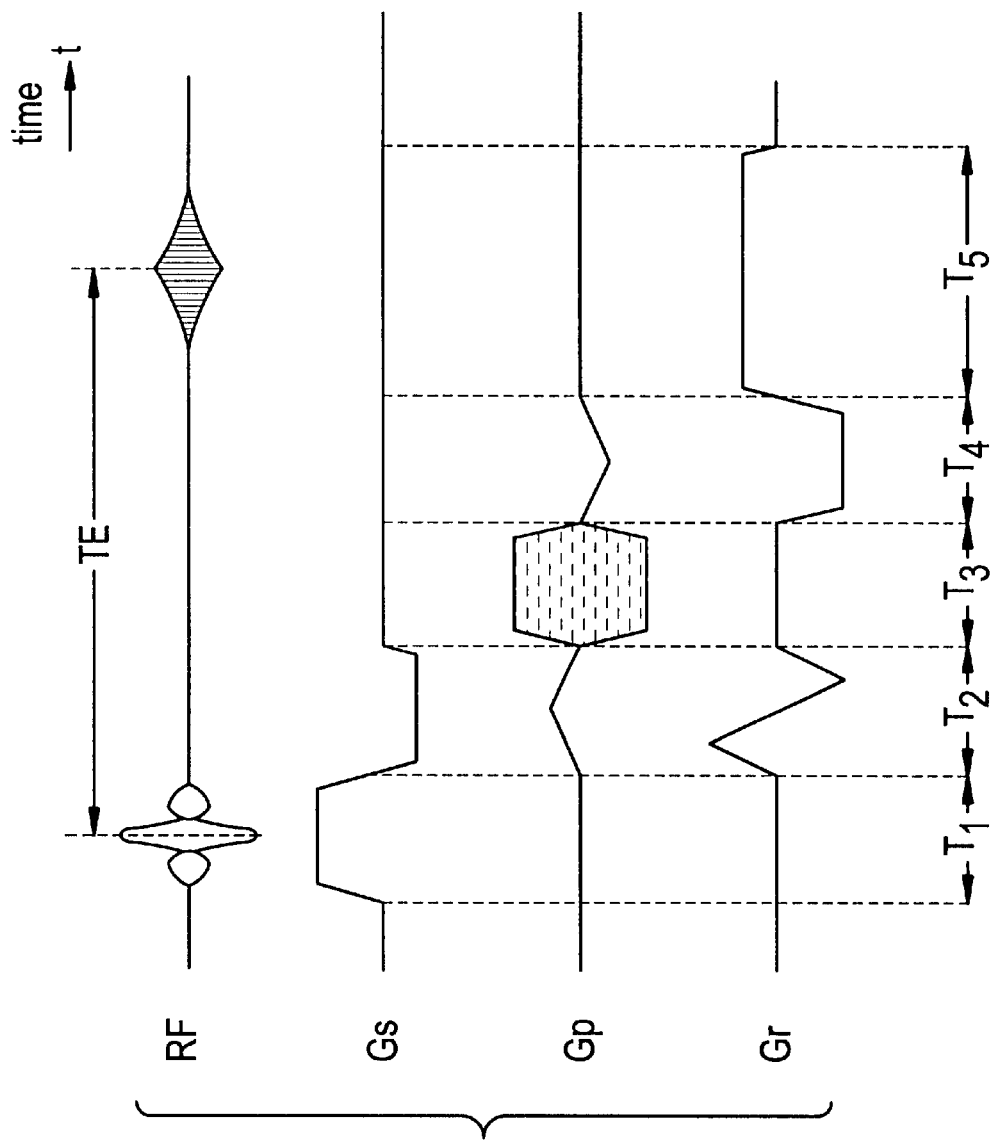
FIG. 8 is a diagram showing an exemplary pulse sequence that is executed by an apparatus shown in FIG. 1 or FIG. 2.

In other words, the flow encode is performed in the direction of the readout gradient Gr and performed in the direction of the phase encode gradient Gp like the pulse sequence shown in FIG. 8. The pulse sequence shown in FIG. 8 is equivalent to the pulse sequence that is formed by removing the flow encode of Gs from the pulse sequence shown in FIG. 3.

Figure 9:
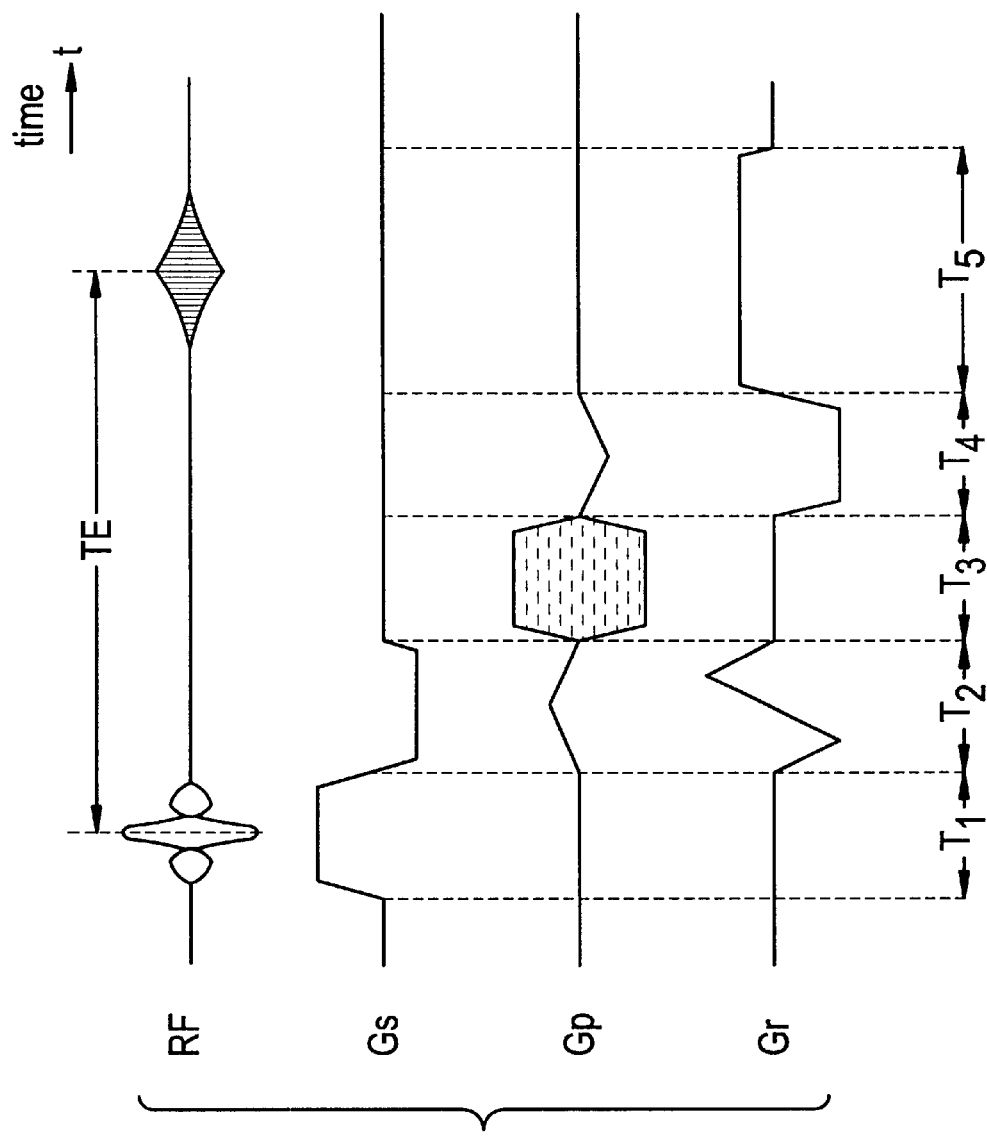
FIG. 9 is a diagram showing another exemplary pulse sequence that is executed by an apparatus shown an FIG. 1 or FIG. 2.

Assuming that this flow encode is the first time flow encode, the second time flow encode in Gr direction is performed according to the pulse sequence shown in FIG. 9. The pulse sequence shown in FIG. 9 is equivalent to the pulse sequence that is formed by removing the flow encode of Gs from the pulse sequence shown in FIG. 4.

Figure 10:
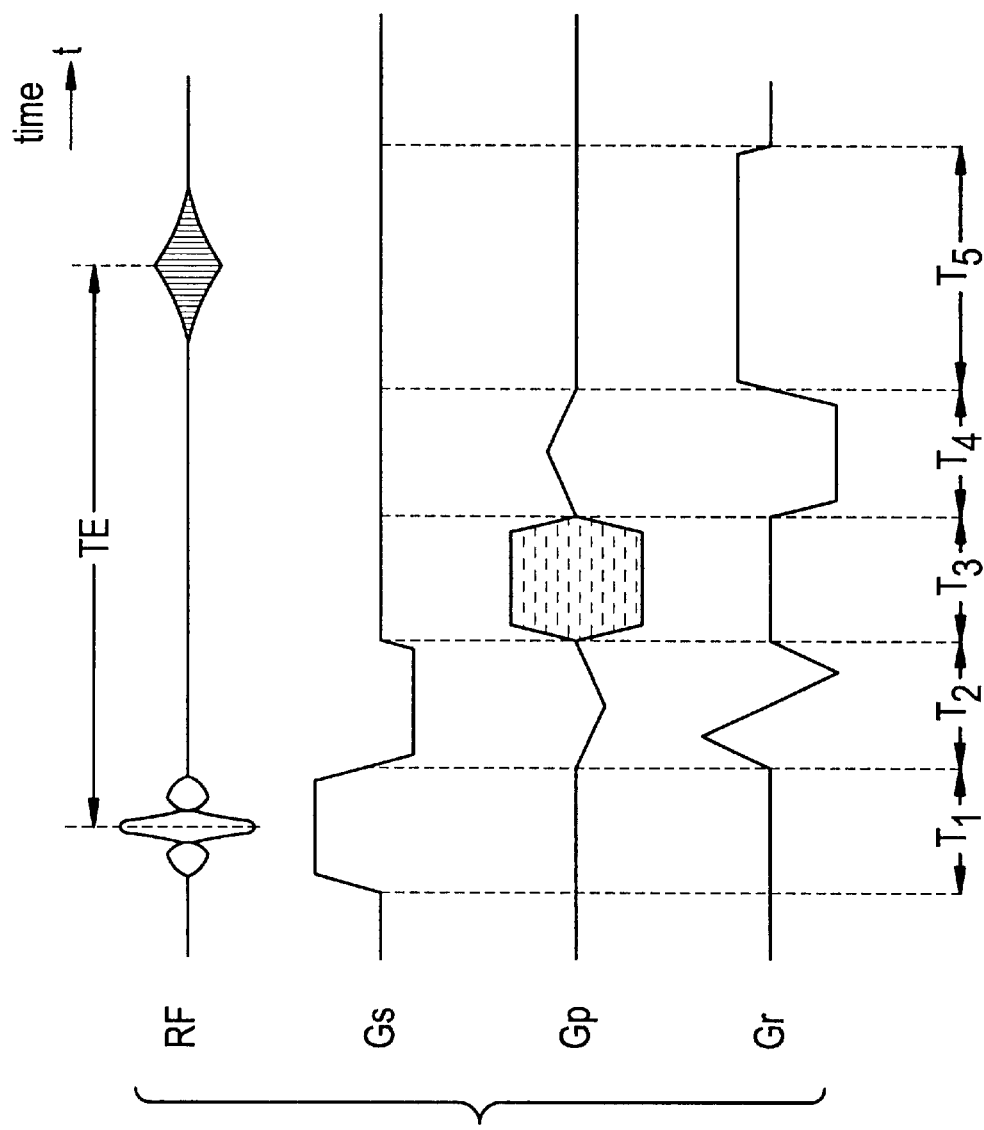
FIG. 10 is a diagram showing another exemplary pulse sequence that is executed by an apparatus shown in FIG. 1 or FIG. 2.

The second time flow encode in Gp direction is performed according to the pulse sequence shown in FIG. 10. The pulse sequence shown in FIG. 10 is equivalent to the pulse sequence that is formed by removing the flow encode of Gs from the pulse sequence shown in FIG. 5.

The difference between the gradient echo obtained from the pulse sequence shown in FIG. 8 and the gradient echo obtained from the pulse sequence shown in FIG. 9 is calculated to obtain the magnetic resonance signal that represents the flow in Gr direction.

The difference between the gradient echo obtained from the pulse sequence shown in FIG. 8 and the gradient echo obtained from the pulse sequence shown in FIG. 10 is calculated to obtain the magnetic resonance signal that represents the flow in Gp direction.

The respective pulse sequences shown in FIG. 8, FIG. 9, and FIG. 10 are treated as one set. Two view data groups including 64 to 512 views that are different in the phase encode magnitude are collected, respective images are restructured from these view data groups, and an image is structured that represents the flow in two-dimensional space including Gr direction and Gp direction by use of the square root extraction value of the sum of squares of the pixel value of the both images.

Figure 11:
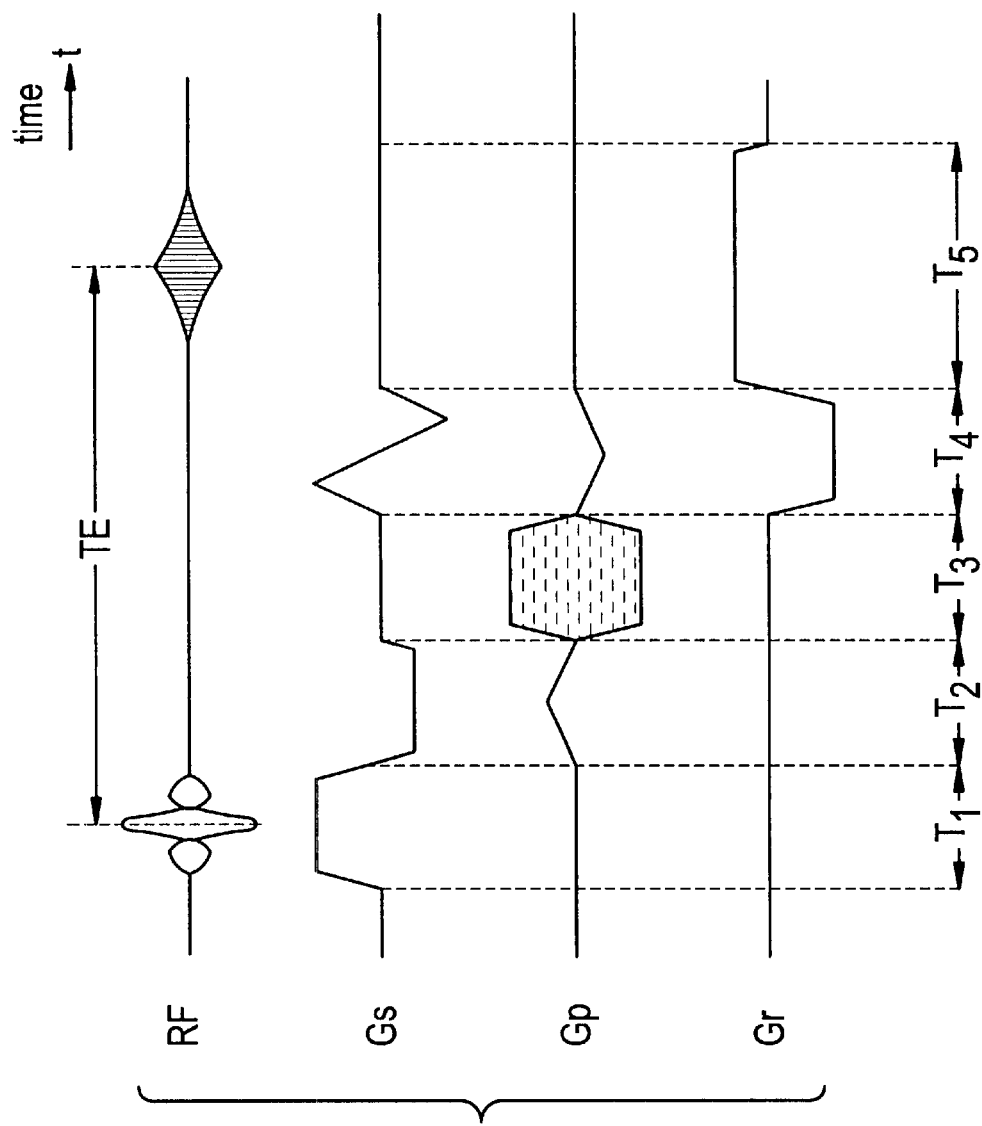
FIG. 11 is a diagram showing another exemplary pulse sequence that is executed by an apparatus shown in FIG. 1 or FIG. 2.
Figure 12:
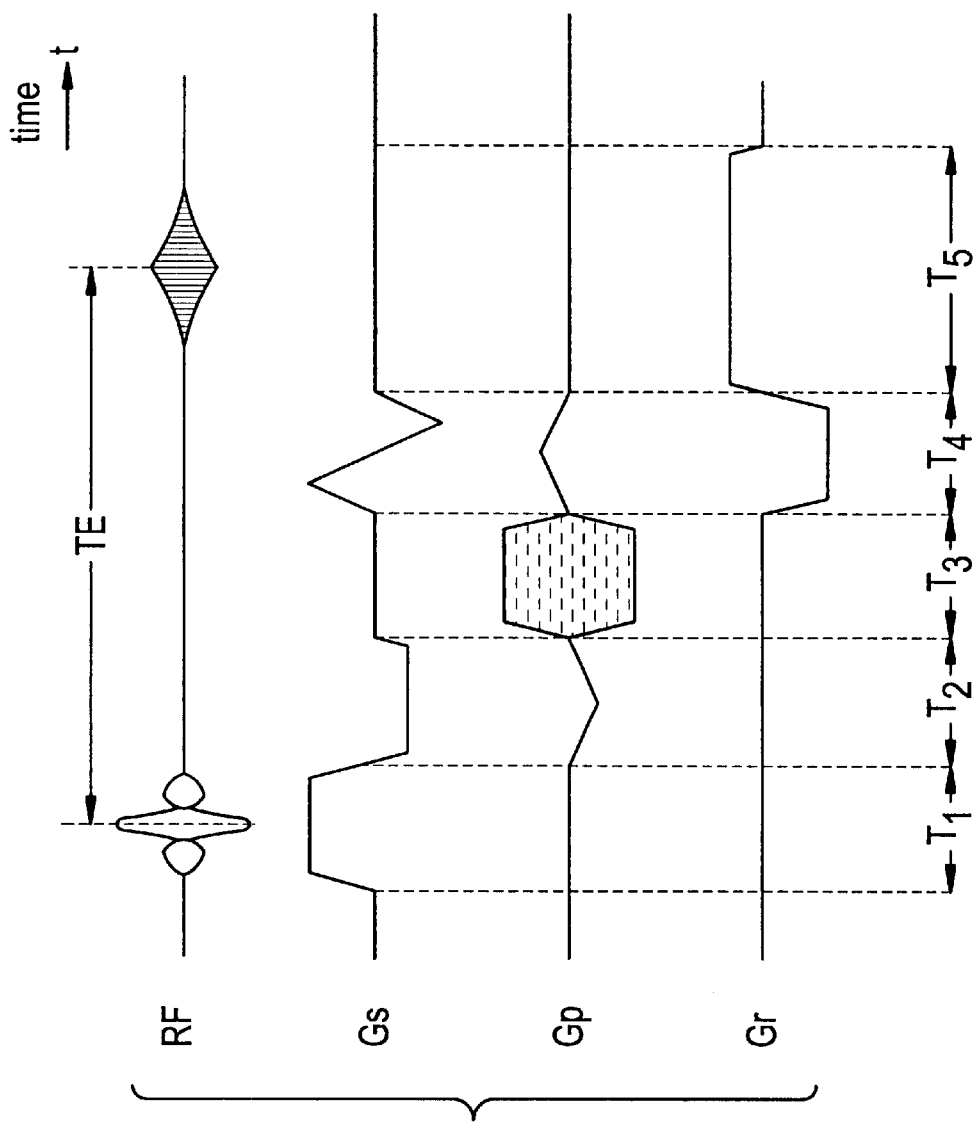
FIG. 12 is a diagram showing another exemplary pulse sequence that is executed by an apparatus shown in FIG. 1 or FIG. 2.
Figure 13:
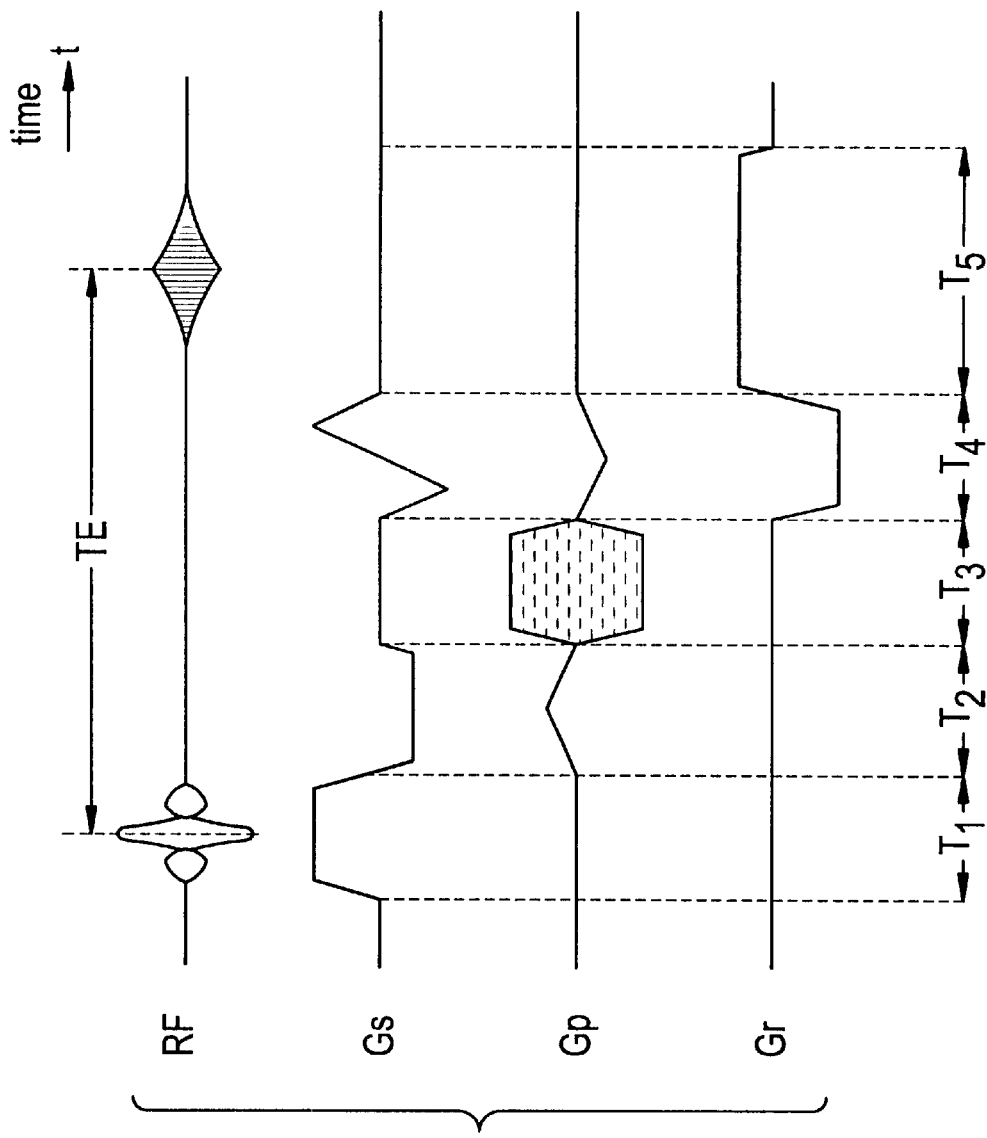
FIG. 13 is a diagram showing another exemplary pulse sequence that is executed by an apparatus shown in FIG. 1 or FIG. 2.

The pulse sequences shown in FIG. 11, FIG. 12, and FIG. 13 are used to obtain the image that represents the flow in two-dimensional space including Gp direction and Gs direction.

The pulse sequence shown in FIG. 11 is equivalent to the pulse sequence that is formed by removing the flow encode of Gr direction from the pulse sequence shown in FIG. 3. This pulse sequence is the pulse sequence of the first time flow encode. The pulse sequence shown in FIG. 12 is equivalent to the pulse sequence that is formed by removing the flow encode of Gr direction from the pulse sequence shown in FIG. 5. This pulse sequence is the pulse sequence of the second time flow encode of the Gp direction. The pulse sequence shown in FIG. 13 is equivalent to the pulse sequence that is formed by removing the flow encode of Gr direction from the pulse sequence shown in FIG. 6. This pulse sequence is the pulse sequence of the second time flow encode of Gs direction.

Figure 14:
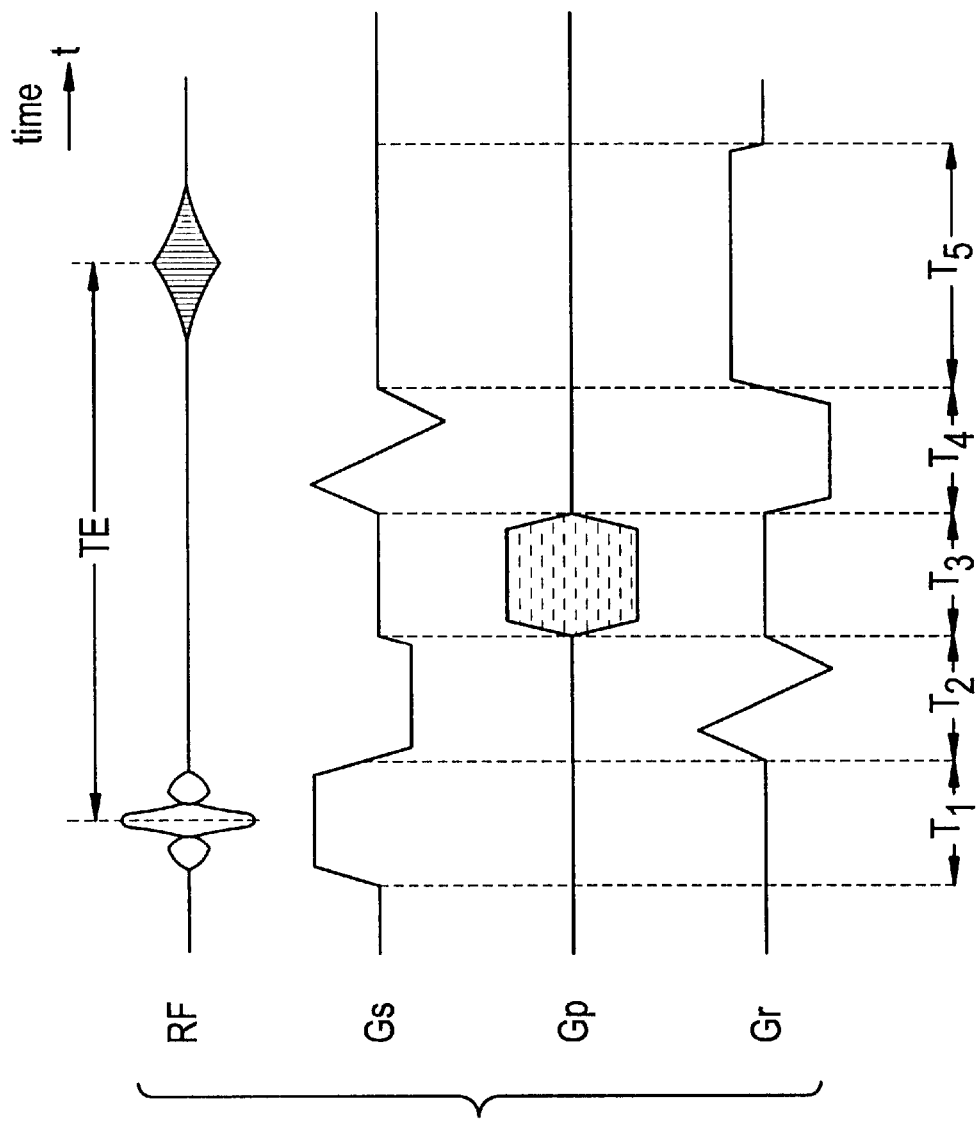
FIG. 14 is a diagram showing another exemplary pulse sequence that is executed by an apparatus shown in FIG. 1 or FIG. 2.
Figure 15:
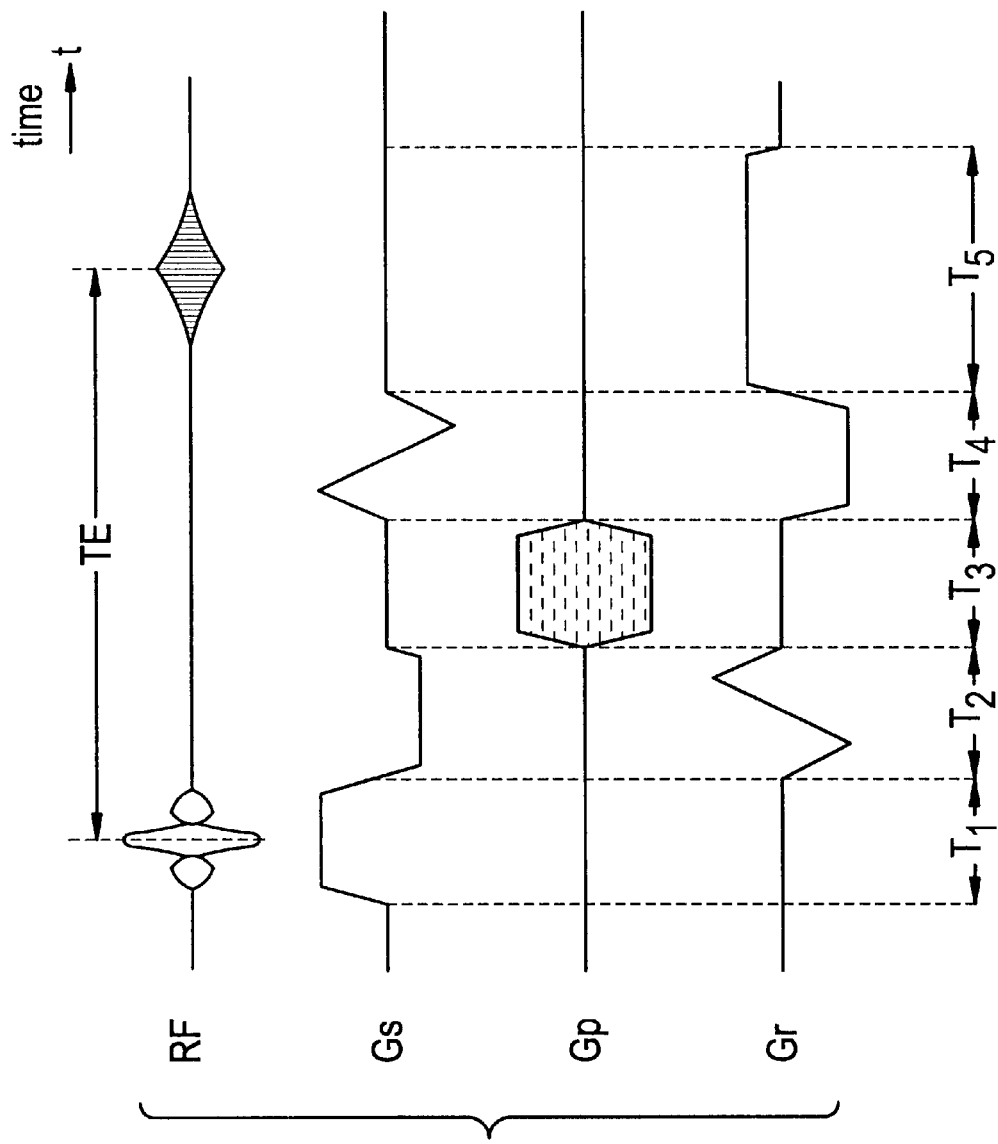
FIG. 15 is a diagram showing another exemplary pulse sequence that is executed by an apparatus shown in FIG. 1 or FIG. 2.
Figure 16:
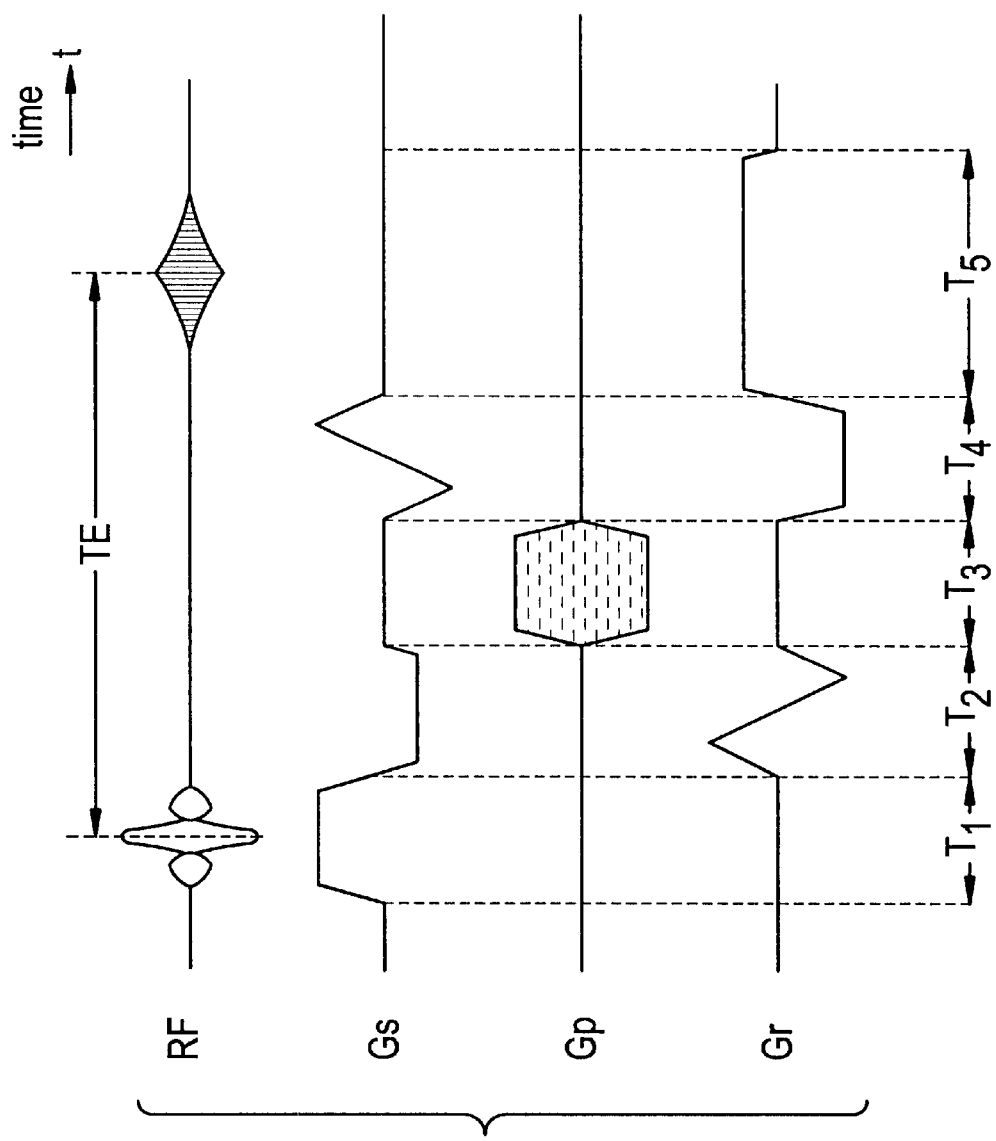
FIG. 16 is a diagram showing another exemplary pulse sequence that is executed by an apparatus shown in FIG. 1 or FIG. 2.

The pulse sequences shown in FIG. 14, FIG. 15, and FIG. 16 are used as one set to obtain the image that represents the flow in two-dimensional space including Gr direction and Gs direction.

The pulse sequence shown in FIG. 14 is equivalent to the pulse sequence that is formed by removing the flow encode of Gp direction from the pulse sequence shown in FIG. 3. This pulse sequence is the pulse sequence of the first time flow encode. The pulse sequence shown in FIG. 15 is equivalent to the pulse sequence that is formed by removing the flow encode of Gp direction from the pulse sequence shown in FIG. 4. This pulse sequence is the pulse sequence of the second time flow encode of Gr direction. The pulse sequence shown in 16 is equivalent to the pulse sequence that is formed by removing the flow encode of Gp direction from the pulse sequence shown in FIG. 6. This pulse sequence is the pulse sequence of the second time flow encode of Gs direction.

The flow encode is performed in any one direction of Gr, Gp, and Gs to obtain the one-dimensional flow image.

Figure 17:
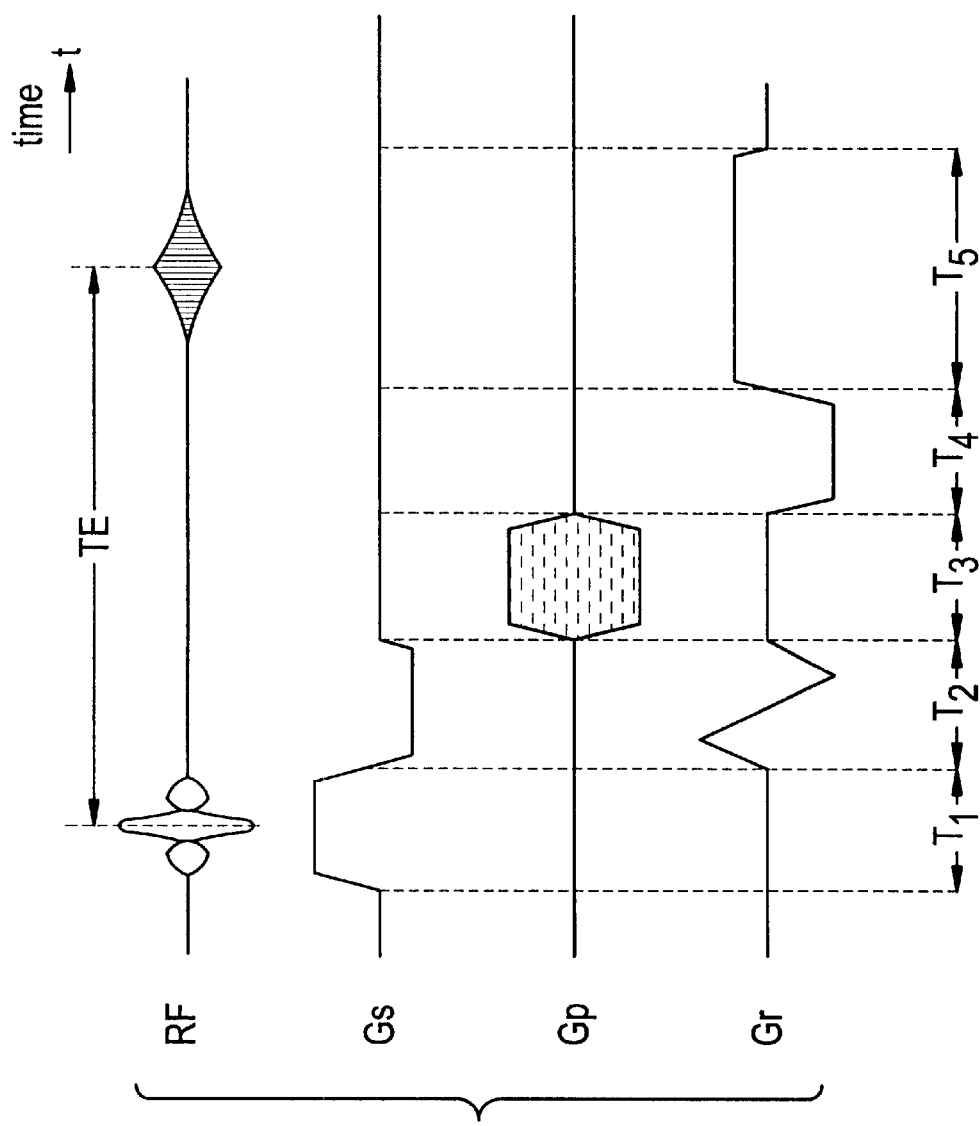
FIG. 17 is a diagram showing another exemplary pulse sequence that is executed by an apparatus shown in FIG. 1 or FIG. 2.

In detail, the flow encode is performed only in the readout gradient Gr direction as shown in FIG. 17. The pulse sequence shown in FIG. 17 is equivalent to the pulse sequence that is formed by removing the flow encode according to Gp from the pulse sequence shown in FIG. 8.

Figure 18:
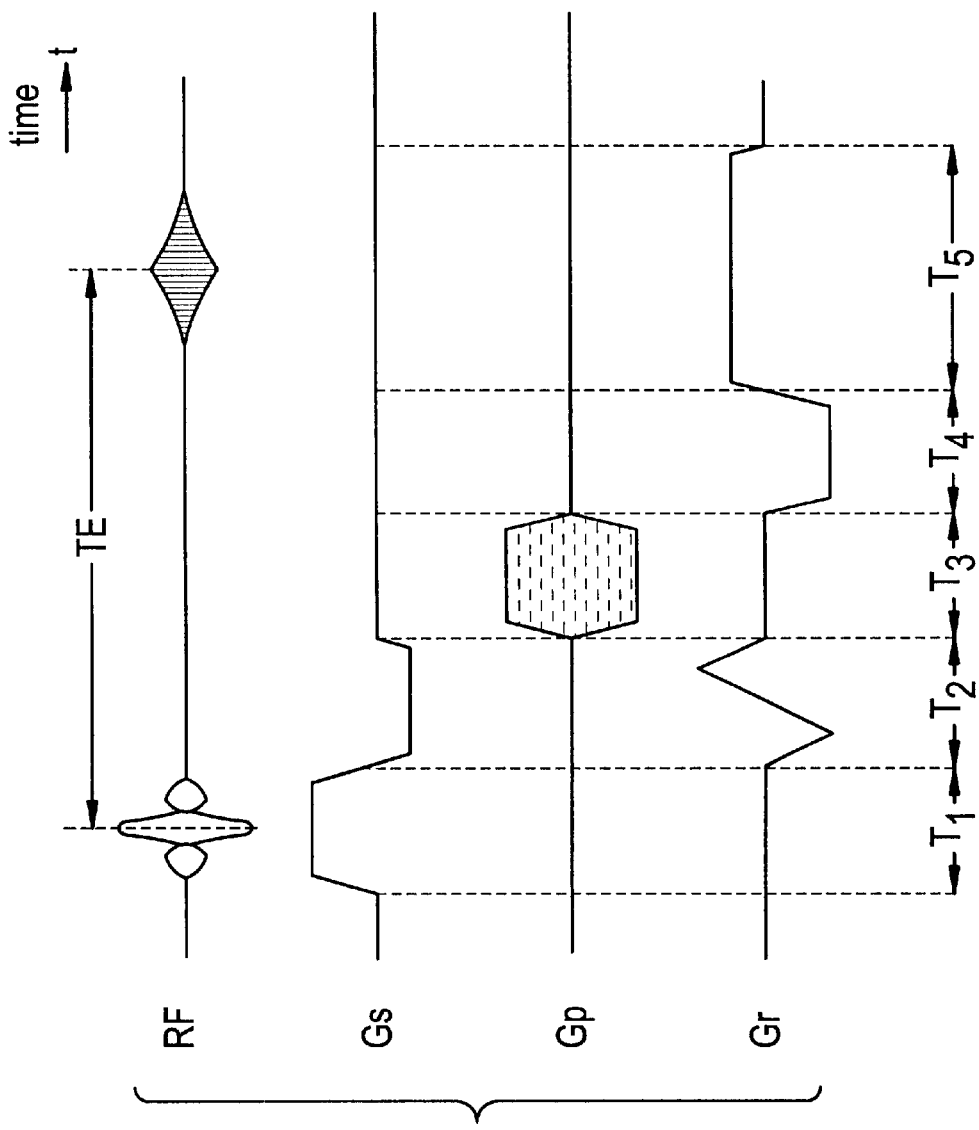
FIG. 18 is a diagram showing another exemplary pulse sequence that is executed by an apparatus shown in FIG. 1 or FIG. 2.

Assuming that this is the first time flow encode, then the second time flow encode of Gr direction is performed according to the pulse sequence shown in FIG. 18. The pulse sequence shown in FIG. 18 is equivalent to the pulse sequence that is formed by removing the flow encode according to Gp from the pulse sequence shown in FIG. 9.

The difference between the gradient echo obtained from the pulse sequence shown in FIG. 17 and the gradient echo obtained from the pulse sequence shown in FIG. 18 is calculated to obtain the magnetic resonance signal that represents the flow in Gr direction.

The pulse sequences shown in FIG. 17 and FIG. 18 are used as one set. The view data including 64 to 512 views that are different in the phase encode magnitude is collected, an image is restructured based on the view data, and an image that represents the flow in Gr direction is obtained.

Figure 19:
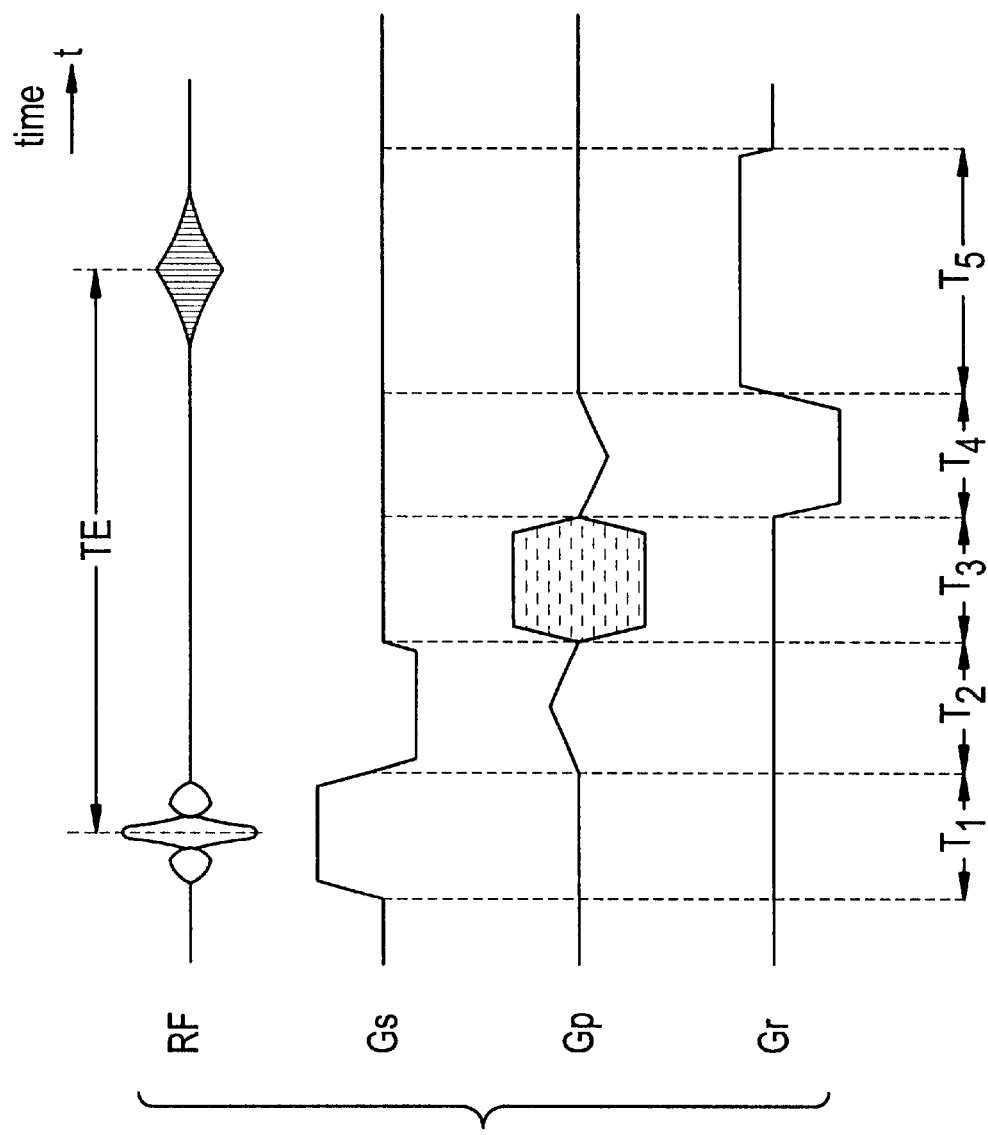
FIG. 19 is a diagram showing another exemplary pulse sequence that is executed by an apparatus shown in FIG. 1 or FIG. 2.
Figure 20:
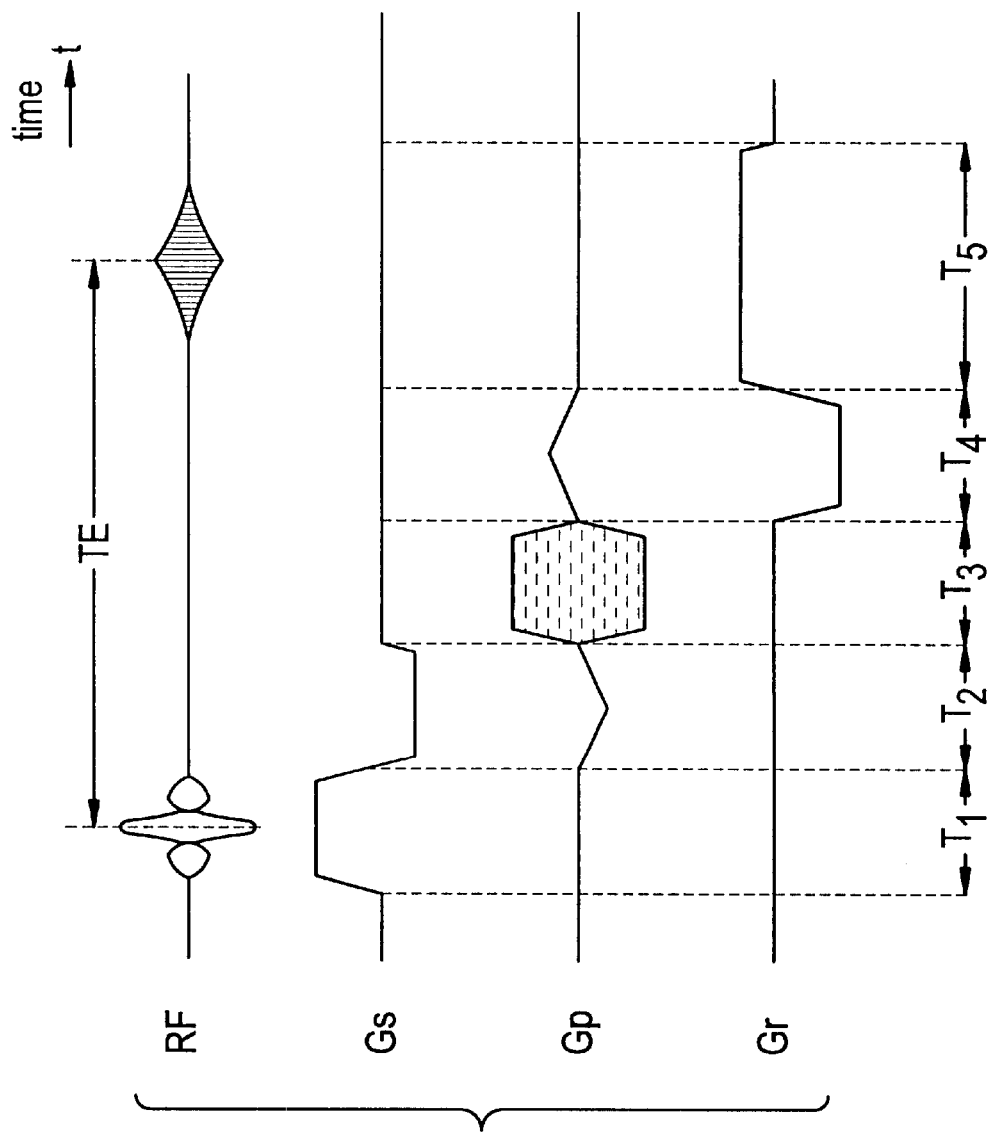
FIG. 20 is a diagram showing another exemplary pulse sequence that is executed by an apparatus shown in FIG. 1 or FIG. 2.

The pulse sequences shown in FIG. 19 and FIG. 20 are used as one set to obtain an image that represents the flow in Gp direction. The pulse sequence shown in FIG. 19 is equivalent to the pulse sequence that is formed by removing the flow encode of Gr direction from the pulse sequence shown in FIG. 8. This pulse sequence is the pulse sequence of the first time flow encode. The pulse sequence shown in FIG. 20 is equivalent to the pulse sequence that is formed by removing the flow encode of Gr direction from the pulse sequence shown in FIG. 10. This pulse sequence is the pulse sequence of the second time flow encode.

Figure 21:
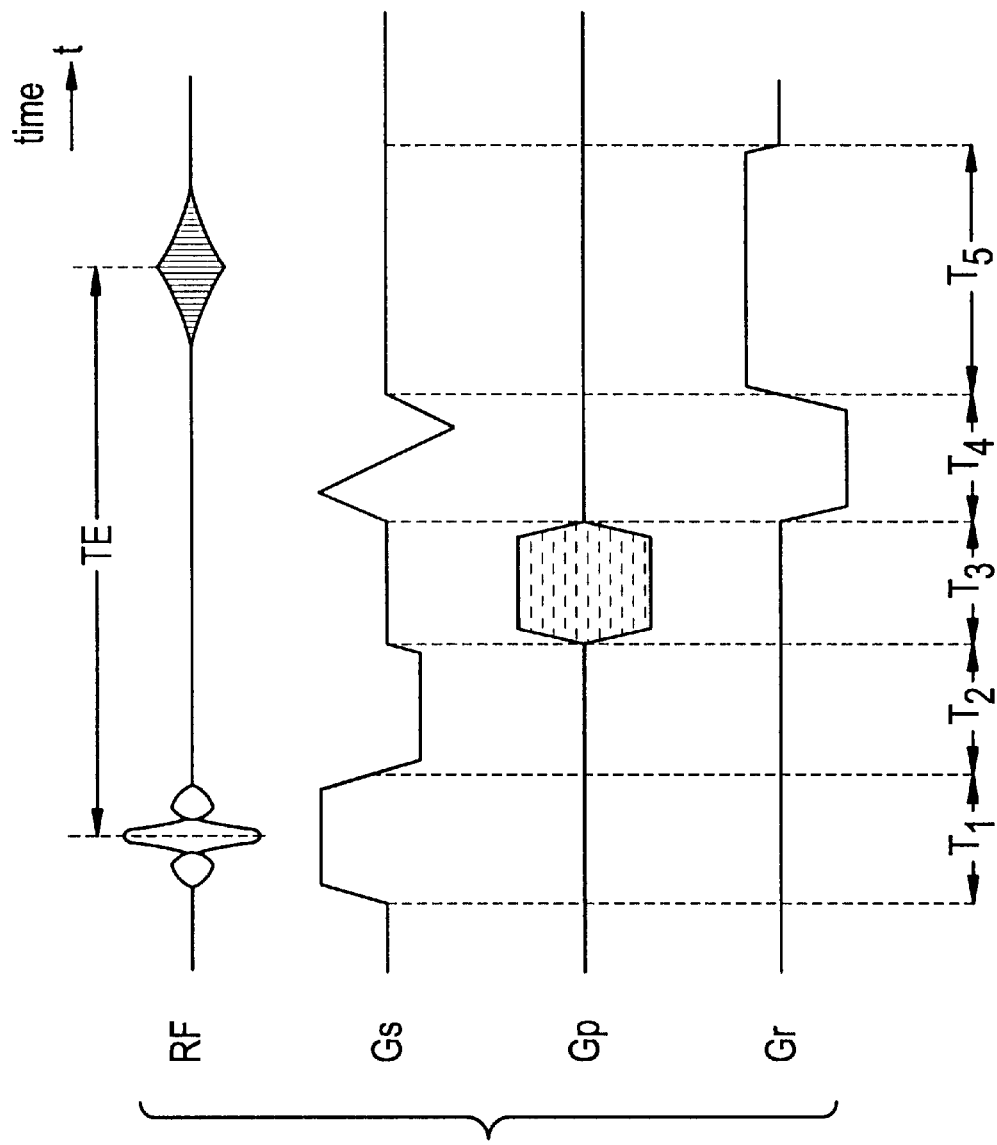
FIG. 21 is a diagram showing another exemplary pulse sequence that is executed by an apparatus shown in FIG. 1 or FIG. 2.
Figure 22:
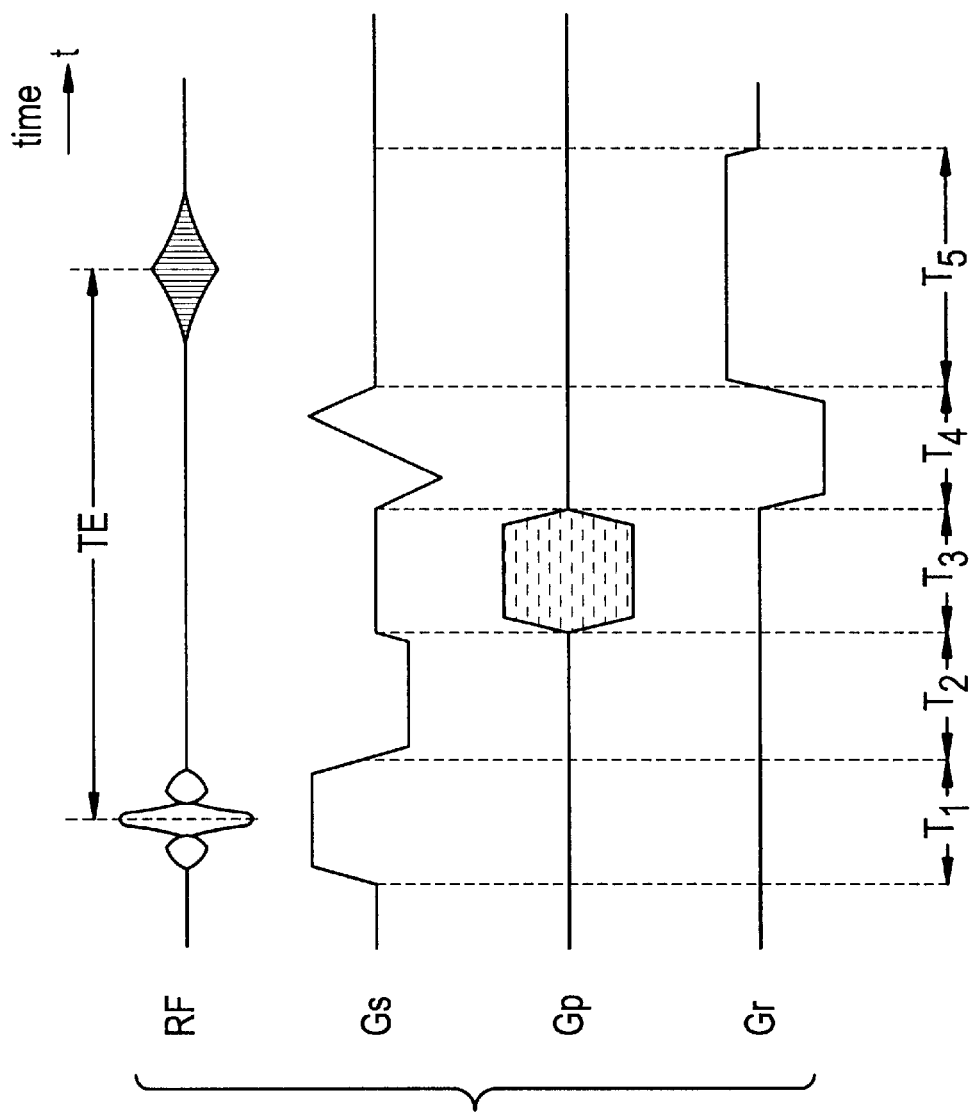
FIG. 22 is a diagram showing another exemplary pulse sequence that is executed by an apparatus shown in FIG. 1 or FIG. 2.

The pulse sequences shown in FIG. 21 and FIG. 22 are used as one set to obtain an image that represents the flow of Gs direction. The pulse sequence shown in FIG. 21 is equivalent to the pulse sequence that is formed by removing the flow encode of Gp direction from the pulse sequence shown in FIG. 11. This pulse sequence is the pulse sequence of the first time flow encode. The pulse sequence shown in FIG. 22 is equivalent to the pulse sequence that is formed by removing the flow encode of Gp direction from the pulse sequence shown in FIG. 13. This pulse sequence is the pulse sequence of the second time flow encode.

Because the gradient echo caused from the static portion is offset in the two-dimensional or one-dimensional flow encode as described hereinabove like in the case of three-dimensional flow encode, the residual image does not remain on the flow image.

Many widely different embodiments of the invention may be configured without departing from the spirit and the scope of the present invention. It should be understood that the present invention is not limited to the specific embodiments described in the specifications except as defined in the appended claims.

What is claimed is:

1. A method for acquiring a magnetic resonance signal from a target with a phase contrast method, said method comprising the steps of:

applying a static magnetic field;

applying a high frequency magnetic field;

applying a slice gradient magnetic field;

applying a phase encode gradient magnetic field;

applying a readout gradient magnetic field; and applying a flow encode gradient magnetic field; wherein said flow encode gradient magnetic field has a first half and a second half in which a gradient of respective halves is reversed and has an equal absolute value of said gradient, and is applied in direction of said readout gradient magnetic field in a time period concurrent with a time period when spin of said target is changed in phase by said slice gradient magnetic field.

2. The method of claim 1, wherein said spin of said target is rephased.

3. The method of claim 1, wherein said spin of said target is dephased.

4. The method of claim 2, wherein another flow encode gradient magnetic field having a first half and a second half in which a gradient of respective halves is reversed and having an equal absolute value of said gradient is applied in direction of a slice gradient magnetic field in a time period con-current with a time period when spin of said target is dephased by said readout gradient magnetic field.

5. The method of claim 2, wherein said first half only or said second half only of said flow encode gradient magnetic field having said first half and said second half is applied when said spin of said target is rephased, and wherein said second half only or said first half only, respectively, of said flow encode gradient magnetic field having said first half and said second half is applied when said spin of said target is dephased.

6. The method of claim 3, wherein said first half only or said second half only of said flow encode gradient magnetic field having said first half and said second half is applied when said spin of said target is rephased, and wherein said second half only or said first half only, respectively, of said flow encode gradient magnetic field having said first half and said second half is applied when said spin of said target is dephased.

7. The method of claim 4, wherein said first half only or said second half only of said flow encode gradient magnetic field or said another flow encode gradient magnetic field is applied when said spin of said target is rephased, and wherein said second half only or said first half only, respectively, of said flow encode gradient magnetic field or said another flow encode gradient magnetic field is applied when said spin of said target is dephased.

8. An apparatus for acquiring a magnetic resonance signal from a target with a phase contrast method, said apparatus comprising:
   means for applying a static magnetic field;
   means for applying a high frequency magnetic field;
   means for applying a slice gradient magnetic field;
   means for applying a phase encode gradient magnetic field;
   means for applying a readout gradient magnetic field; and
   means for applying a flow encode gradient magnetic field, said flow encode gradient magnetic field having a first half and a second half in which a gradient of respective halves is reversed and having an equal absolute value of said gradient, wherein said means for applying a flow encode gradient magnetic field comprises:
      first means for applying said flow encode gradient magnetic field in direction of said readout gradient magnetic field in a time period concurrent with a time period when spin of said target is changed in phase by said slice gradient magnetic field.

9. The apparatus of claim 8, wherein said first means applies said flow encode gradient magnetic field in a time period when said spin of said target is rephased.

10. The apparatus of claim 8, wherein said first means applies said flow encode gradient magnetic field in a time period when said spin of said target is dephased.

11. The apparatus of claim 9, said means for applying a flow encode gradient magnetic field further comprises:
   second means for applying another flow encode gradient magnetic field in direction of said readout gradient magnetic field in a time period concurrent with a time period when spin of said target is dephased by said slice gradient magnetic field.

12. The apparatus of claim 9, wherein said first means comprises:
   third means for applying said first half only or said second half only of said flow gradient magnetic field having said first half and said second half when said spin of said target is rephased, and for applying said second half only or said first half only, respectively, of said flow encode gradient magnetic field having said first half and said second half when said spin of said target is dephased.

13. The apparatus of claim 10, wherein said first means comprises:
   third means for applying said first half only or said second half only of said flow gradient magnetic field having said first half and said second half when said spin of said target is rephased, and for applying said second half only or said first half only, respectively, or said flow encode gradient magnetic field having said first half and said second half when said spin of said target is dephased.

14. The method of claim 11, wherein said second means comprises fourth means for applying said first half only or said second half only of said another flow encode gradient magnetic field when said spin of said target is rephased, and for applying said second half only or said first half only, respectively, of said another flow encode gradient magnetic field when said spin of said target is dephased.

15. An apparatus for acquiring a magnetic resonance signal from a target with a phase contrast method, said apparatus comprising:
   means for applying a static magnetic field;
   means for applying a high frequency magnetic field;
   means for applying a slice gradient magnetic field;
   means for applying a phase encode gradient magnetic field;
   means for applying a readout gradient magnetic field;
   means for applying a flow encode gradient magnetic field, said flow encode gradient magnetic field having a first half and a second half in which a gradient of respective halves is reversed and having an equal absolute value of said gradient; and
   means for structuring an image based on acquired magnetic resonance signal; wherein further comprising:
   first means for causing said means for applying a flow encode gradient magnetic field to apply said flow encode gradient magnetic field in direction of said readout gradient magnetic field in a time period concurrent with a time period when spin of said target is changed in phase by said slice gradient magnetic field.

16. The apparatus of claim 15, wherein said first means causes said means for applying said flow encode gradient magnetic field to apply said flow encode gradient magnetic field in a time period when said spin of said target is rephased.

17. The apparatus of claim 15, wherein said first means causes said means for applying said flow encode gradient magnetic field to apply said flow encode gradient magnetic field in a time period when said spin of said target is dephased.

18. The apparatus of claim 16, further comprising: second means for causing said means for applying a flow encode gradient magnetic field to apply another flow encode gradient magnetic field in a direction of said readout gradient magnetic field in a time period concurrent with a time period when spin of said target is dephased by said slice gradient magnetic field.

19. The apparatus of claim 16, wherein said first means causes said means for applying said flow encode gradient magnetic field to apply said first half only or said second half only of said flow gradient magnetic field having said first half and said second half when said spin of said target is rephased, and to apply said second half only or said first half only, respectively, of said flow encode gradient magnetic field having said first half and said second half when said spin of said target is dephased.

20. The apparatus of claim 17, wherein said first means causes said means for applying said flow encode gradient magnetic field to apply said first half only or said second half only of said flow gradient magnetic field having said first half and said second half when said spin of said target is rephased, and to apply said second half only or said first half only, respectively, of said flow encode gradient, magnetic field having said first half and said second half only when said spin of said target is dephased.

21. The apparatus of claim 18, wherein said second means causes said means for applying a flow encode gradient magnetic field to apply said first half only or said second half only of said another flow encode gradient magnetic field when said spin of said target is rephased, and to apply said second half only or said first half only, respectively, of said another fbi encode gradient magnetic field when said spin of said target is dephased.

* * * * *